(12) United States Patent
Carey et al.

(10) Patent No.: US 7,791,844 B2
(45) Date of Patent: Sep. 7, 2010

(54) MAGNETORESISTIVE SENSOR HAVING A MAGNETICALLY STABLE FREE LAYER WITH A POSITIVE MAGNETOSTRICTION

(75) Inventors: Matthew Joseph Carey, San Jose, CA (US); Jeffrey Robinson Childress, San Jose, CA (US); Stefan Maat, San Jose, CA (US); James L. Nix, Morgan Hill, CA (US)

(73) Assignee: Hitachi Global Storage Technologies Netherlands B.V., Amsterdam (NL)

( * ) Notice: Subject to any disclaimer, the term of this patent is extended or adjusted under 35 U.S.C. 154(b) by 685 days.

(21) Appl. No.: 11/737,701

(22) Filed: Apr. 19, 2007

(65) Prior Publication Data

US 2007/0281079 A1    Dec. 6, 2007

Related U.S. Application Data

(63) Continuation-in-part of application No. 11/542,086, filed on Oct. 2, 2006, now Pat. No. 7,446,984, which is a continuation-in-part of application No. 11/304,033, filed on Dec. 14, 2005, now Pat. No. 7,529,066.

(51) Int. Cl.
*G11B 5/39* (2006.01)
(52) U.S. Cl. ................................. 360/324.12
(58) Field of Classification Search ............... 360/324.1, 360/324.11, 324.12, 324.2
See application file for complete search history.

(56) References Cited

U.S. PATENT DOCUMENTS 7,189,583 B2 * 3/2007 Drewes .......................... 438/3
2006/0256484 A1 * 11/2006 Sato et al. ................ 360/324.2

* cited by examiner

Primary Examiner—Jefferson Evans
(74) Attorney, Agent, or Firm—Zilka-Kotab, PC

(57) ABSTRACT

A magnetoresistive sensor having a magnetically stable free layer fabricated from a material having a positive magnetostriction such as a Co—Fe—B alloy. Although the free layer is fabricated from a material that has a positive magnetostriction, which would ordinarily make the free layer unstable, the magnetization of the free layer remains stable because of an induced magnetic anisotropy that has an easy axis of magnetization oriented parallel to the Air-bearing Surface (ABS). This magnetic anisotropy of the free layer is induced by an anisotropic texturing of the surface of the free layer. The resulting anisotropic surface texture is produced by an ion milling process that utilizes an ion beam directed at an acute angle relative to the normal to the surface of the wafer whereon the sensor is fabricated while the wafer is held on a stationary chuck. This angled, static ion milling produces an anisotropic surface texture, or roughness, of the free layer, which results in the above described magnetic anisotropy with an easy axis of magnetization in a desired orientation.

18 Claims, 37 Drawing Sheets

MAGNETORESISTIVE SENSOR HAVING A MAGNETICALLY STABLE FREE LAYER WITH A POSITIVE MAGNETOSTRICTION

RELATED APPLICATION

This application is a Continuation In Part of commonly assigned U.S. patent application Ser. No. 11/542,086 entitled MAGNETIC RANDOM ACCESS MEMORY (MRAM) HAVING INCREASED REFERENCE LAYER ANISOTROPY THROUGH ION BEAM ETCH OF MAGNETIC LAYERS, filed Oct. 2, 2006 now U.S. Pat. No. 7,446,984, which is, itself, a Continuation in Part of commonly assigned U.S. patent application entitled MAGNETORESISTIVE SENSOR HAVING MAGNETIC LAYERS WITH TAILORED MAGNETIC ANISOTROPY INDUCED BY DIRECT ION MILLING, application Ser. No. 11/304,033 Filed Dec. 14, 2005 now U.S. Pat. No. 7,529,066, both of which are hereby incorporated by reference.

FIELD OF THE INVENTION

The present invention relates to magnetoresistive (MR) sensors, and more particularly, to giant magnetoresistive (GMR) sensors having a free layer with a positive magnetostriction wherein the magnetic state of the free layer is stabilized by a strong magnetic anisotropy with an easy axis of magnetization that is produced by anisotropic texturing of the surface of the free layer.

BACKGROUND OF THE INVENTION

The heart of a computer's long-term memory is an assembly that is referred to as a magnetic disk drive. The magnetic disk drive includes a rotating magnetic disk, write and read heads that are suspended by a suspension arm adjacent to a surface of the rotating magnetic disk and an actuator that swings the suspension arm to place the read and write heads over selected circular tracks on the rotating disk. The read and write heads are directly located on a slider that has an air-bearing surface (ABS). The suspension arm biases the slider toward the surface of the disk and when the disk rotates, air adjacent to the surface of the disk moves along with the disk. The slider flies on this moving air at a very low elevation, fly height, over the surface of the disk. This fly height is on the order of nanometers. When the slider rides on the air bearing, the write and read heads are employed for writing magnetic transitions to and reading magnetic transitions from the rotating disk. The read and write heads are connected to processing circuitry that operates according to a computer program to implement the writing and reading functions.

In a typical design, the write head includes a coil layer embedded in first, second and third insulation layers, an insulation stack, the insulation stack being sandwiched between first and second pole-piece layers. A gap is formed between the first and second pole-piece layers by a gap layer at an air-bearing surface (ABS) of the write head and the pole-piece layers are connected at a back gap. Current conducted to the coil layer induces a magnetic flux in the pole pieces which causes a magnetic field to fringe out at a write gap at the ABS for the purpose of writing the aforementioned magnetic transitions in tracks on the moving media, such as in circular tracks on the aforementioned rotating disk.

In recent read head designs, a spin-valve (SV) sensor, also referred to as a giant magnetoresistive (GMR) sensor, has been employed for sensing magnetic fields from the rotating magnetic disk. This sensor includes a nonmagnetic conductive layer, hereinafter referred to as a spacer layer, sandwiched between first and second ferromagnetic layers, hereinafter referred to as a pinned layer and a free layer, both of which can be made up by a plurality of layers. First and second leads are connected to the spin-valve sensor for conducting a sense current therethrough. The magnetization of the pinned layer is pinned substantially perpendicular to the air-bearing surface (ABS) and is relatively insensitive to applied magnetic fields. The magnetic moment of the free layer is biased substantially parallel to the ABS, but is free to rotate in response to external magnetic fields. In the following, substantially parallel means closer to parallel than perpendicular; and, substantially perpendicular means closer to perpendicular than parallel. The magnetization of the pinned layer is typically pinned by exchange coupling with an antiferromagnetic layer.

For a current-in-plane, spin-valve (CIP-SV) sensor, the thickness of the spacer layer is chosen to be less than the mean free path of conduction electrons through the sensor. With this arrangement, a portion of the conduction electrons is scattered by the interfaces of the spacer layer with each of the pinned and free layers. When the magnetizations of the pinned and free layers are parallel with respect to one another, scattering is minimal; and, when the magnetizations of the pinned and free layer are antiparallel, scattering is maximized. Changes in scattering alter the resistance of the spin-valve sensor in proportion to cos θ, where θ is the angle between the magnetizations of the pinned and free layers. Since θ is near 90 degrees at zero field, the resistance of the spin-valve sensor, for small rotations of the free layer from 90 degrees, changes proportionally to the magnitudes of the magnetic fields from the rotating disk. When a sense current is conducted through the spin-valve sensor, resistance changes cause potential changes that are detected and processed as read-back signals.

When a spin-valve sensor employs a single magnetic layer as a pinned-layer structure, it is referred to as a simple spin valve. When a spin valve employs an antiparallel (AP) pinned-layer structure, it is referred to as an AP-pinned spin valve. An AP-pinned spin valve includes first and second magnetic layers separated by a thin nonmagnetic coupling layer such as Ru or Ir. The thickness of the coupling layer is chosen so as to antiparallel couple the magnetic moments of the ferromagnetic layers of the pinned-layer structure. A spin valve is also characterized as a top or bottom spin valve depending upon whether the pinning layer is at the top, formed after the free layer, or at the bottom, before the free layer.

Magnetization of the pinned layer is usually fixed by exchange coupling one of the ferromagnetic layers (AP1) with a layer of antiferromagnetic material such as a Pt—Mn alloy with nominally 50 atomic percent Mn. While an antiferromagnetic (AFM) material such as a Pt—Mn alloy does not, in and of itself, have a net magnetic moment, when exchange coupled with a magnetic material, it can strongly pin the magnetization of the ferromagnetic layer.

A current-in-plane, spin-valve (CIP-SV) sensor is located between first and second nonmagnetic electrically insulating read gap layers; and, the first and second read gap layers are located between ferromagnetic first and second shield layers. In a merged magnetic head, a single ferromagnetic layer functions as the second shield layer of the read head and as the first pole-piece layer of the write head. In a piggyback head, the second shield layer and the first pole-piece layer are separate layers.

The ever increasing demand for greater data rate and recording density has lead a push to develop sensors having ever decreasing dimensions, such as decreased magnetic read width (MRW), driven by narrower track widths (TW) of the data recorded onto the magnetic recording disk, and stripe height (SH), which is the distance that the sensor extends back away from the ABS. However, as described above, in order for a magnetoresistive sensor to operate as desired, various layers such as the free and pinned layers must be in essentially single magnetic domain states having magnetizations oriented in desired directions. For example, the free layer must remain biased in a direction substantially parallel with the ABS, while the pinned layer must have a magnetization that remains pinned in a desired direction substantially perpendicular to the ABS. As sensors become smaller, the ability to maintain these magnetic states diminishes greatly. Free layers lose biasing, becoming unstable, and pinned layer magnetizations can flip, a situation that leads to amplitude flipping. Both of these situations render the sensor unusable. A technique for generating a magnetic anisotropy with an easy axis of magnetization in any desired direction in the various layers would greatly facilitate sensor robustness by stabilizing single domain states having magnetizations oriented in desired directions.

In a similar manner, the performance of other components of a magnetic recording system would be greatly improved if a magnetic anisotropy could be generated with an associated easy axis of magnetization that could be oriented in any desired direction. For example, the performance of a magnetic write element, magnetic shields, or a magnetic recording medium could be greatly improved, if a technique existed for orienting the easy axis of magnetization in a desired direction in such devices. Likewise, the performance of magnetic memory cells that incorporate magnetoresistive memory elements can be greatly improved, if a magnetic anisotropy could be generated with an associated easy axis magnetization that could be oriented in any desired direction.

SUMMARY OF THE INVENTION

The present invention provides a magnetoresistive sensor that has a magnetically stable free layer with a positive magnetostriction and a magnetic anisotropy with an ion-milling-induced easy axis of magnetization oriented parallel to the Air-bearing Surface (ABS). The free layer has a surface that is configured with an anisotropic surface texture, or roughness, that induces the magnetic anisotropy in the free layer.

The anisotropic surface texture of the free layer can be produced by a static, angled ion-milling process. The resulting magnetic anisotropy of the free layer advantageously allows a wider range of materials to be used in the free layer, even if those materials have a positive magnetostriction. For example, the free layer can be fabricated from a Co—Fe—B alloy, which has been found to provide improved sensor performance, such as increased ΔR/R, i.e. GMR, and/or TMR ratio.

These and other features and advantages of the invention will be apparent upon reading the following detailed description of various embodiments of the present invention taken in conjunction with the Figures, in which like reference numerals indicate like elements throughout.

BRIEF DESCRIPTION OF THE DRAWINGS

For a fuller understanding of the nature and advantages of this invention, as well as the preferred mode of use, reference should be made to the following detailed description read in conjunction with the accompanying drawings, which are not to scale.

DETAILED DESCRIPTION OF THE INVENTION

The following is a description of various embodiments presently contemplated for carrying out this invention. This description is made for the purpose of illustrating the general principles of this invention and is not meant to limit the inventive concepts claimed herein.

Figure 1:
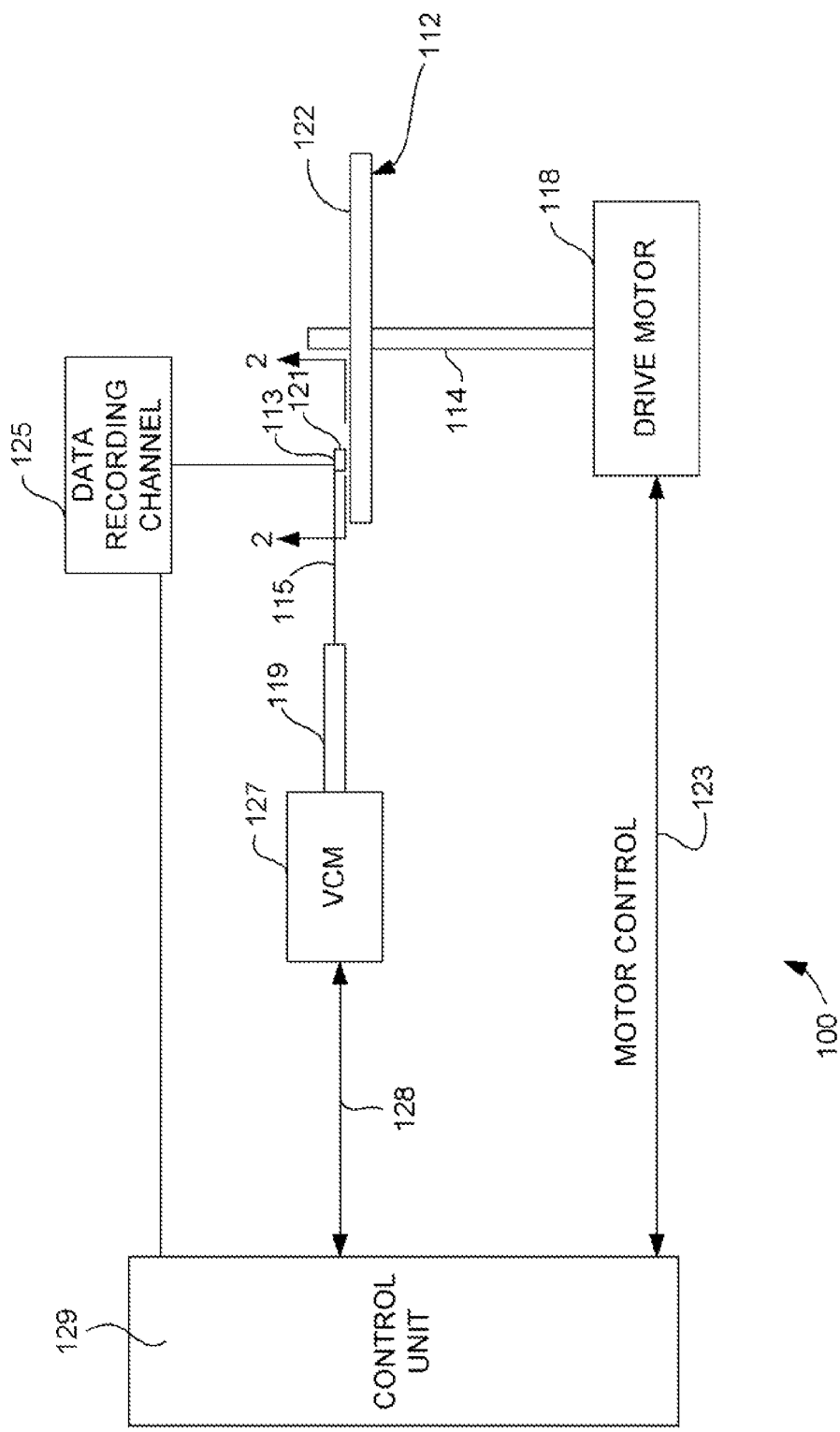
FIG. 1 is a schematic illustration of a disk drive system in which the invention might be embodied.

Referring now to FIG. 1, there is shown a disk drive 100 embodying this invention. As shown in FIG. 1, at least one rotatable magnetic disk 112 is supported on a spindle 114 and rotated by a disk drive motor 118. The magnetic recording on each disk is in the form of annular patterns of concentric data tracks (not shown) on the magnetic disk 112.

At least one slider 113 is positioned near the magnetic disk 112, each slider 113 supporting one or more magnetic head assemblies 121. As the magnetic disk rotates, slider 113 moves radially in and out over the disk surface 122 so that the magnetic head assembly 121 may access different tracks of the magnetic disk where desired data are written or read. Each slider 113 is attached to an actuator arm 119 by way of a suspension 115. The suspension 115 provides a slight spring force, which biases slider 113 against the disk surface 122. Each actuator arm 119 is attached to an actuator means 127. The actuator means 127 as shown in FIG. 1 may be a voice coil motor (VCM). The VCM comprises a coil movable within a fixed magnetic field, the direction and speed of the coil movements being controlled by the motor current signals supplied by controller 129.

During operation of the disk storage system, the rotation of the magnetic disk 112 generates an air bearing between the slider 113 and the disk surface 122, which exerts an upward force or lift on the slider. The air bearing thus counter-balances the slight spring force of suspension 115 and supports slider 113 off and slightly above the disk surface by a small, substantially constant spacing during normal operation.

The various components of the disk storage system are controlled in operation by control signals generated by control unit 129, such as access control signals and internal clock signals. Typically, the control unit 129 comprises logic control circuits, storage means and a microprocessor. The control unit 129 generates control signals to control various system operations such as drive motor control signals on line 123 and head position and seek control signals on line 128. The control signals on line 128 provide the desired current profiles to optimally move and position slider 113 to the desired data track on disk 112. Write and read signals are communicated to and from write and read heads 121 by way of recording channel 125.

Figure 2:
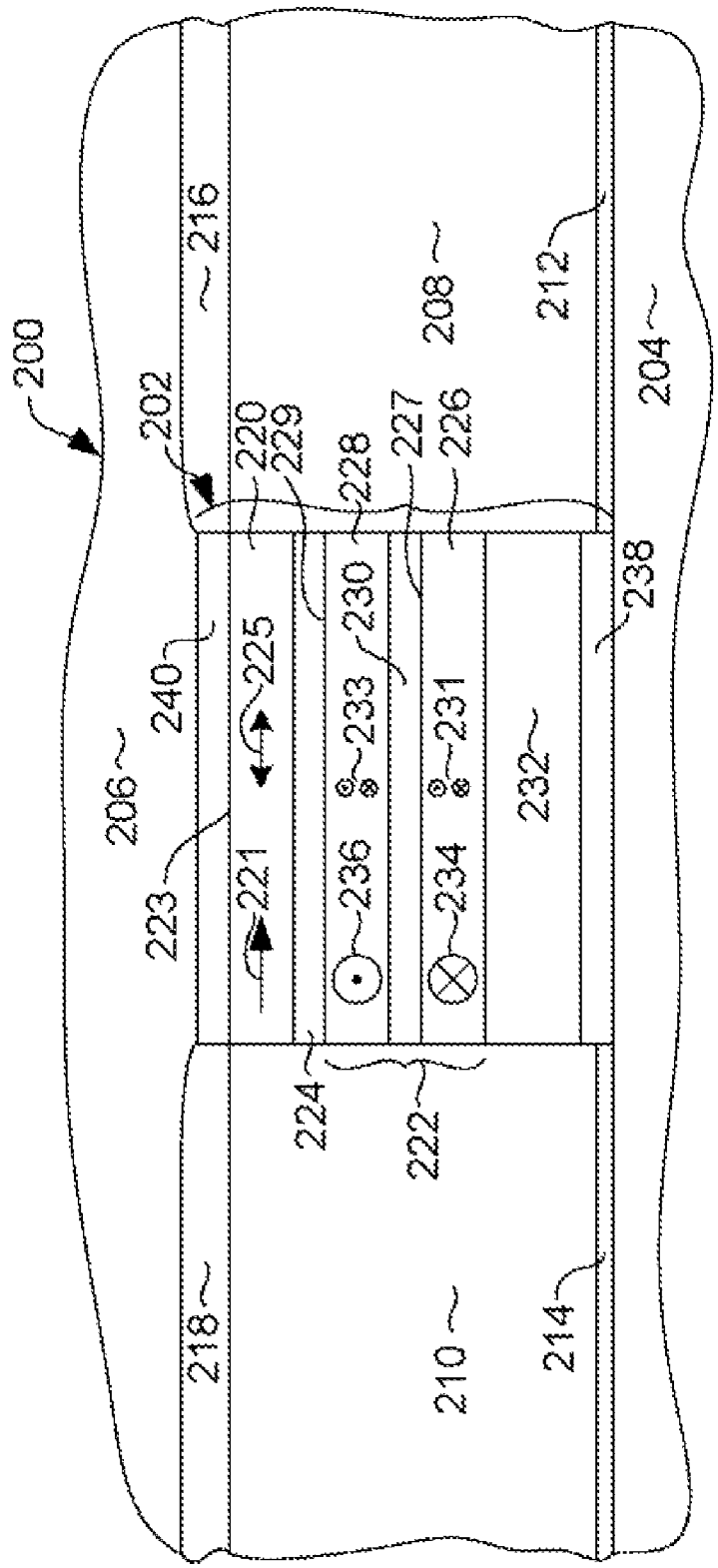
FIG. 2 is an ABS view of a sensor according to an embodiment of the invention.

Magnetoresistive Sensor Having Magnetic Layers With Tailored Anisotropy Induced By Direct Ion Milling With reference now to FIG. 2, a magnetoresistive sensor 200 according to the present invention is described. The sensor 200 includes a sensor stack 202 sandwiched between first and second nonmagnetic, electrically insulating gap layers 204, 206. The first and second hard-bias layers 208, 210 extend laterally from the sides of the sensor stack 202. The hard-bias layers may be deposited over seed layers 212, 214. First and second leads 216, 218 are deposited over the hard-bias layers 208, 210, and may be fabricated from, for example, Au, Rh or some other electrically conductive material.

With continued reference to FIG. 2, the sensor stack 202 includes a magnetic free layer 220, a magnetic pinned-layer structure 222 and a spacer layer 224 sandwiched between the free and pinned-layer structure 220, 222. The free layer 220 has a magnetic moment 221 that is biased in a direction substantially parallel with the ABS, but that is free to rotate in response to a magnetic field. The pinned-layer structure 222 may be of various configurations, such as simple, AP-coupled, AFM-pinned or self-pinned. The free layer 220 can be fabricated from one or more layers of for example, a Ni—Fe alloy, Co, a Co—Fe alloy, or other sufficiently soft magnetic material, preferably with a layer of Co, or a Co—Fe alloy, adjacent to the spacer layer 224. The spacer layer 224 can be fabricated from a nonmagnetic, electrically conductive material such as Cu.

The pinned-layer structure 222 is preferably an AP-coupled, pinned-layer structure having first and second magnetic layers AP1 226 and AP2 228 which are antiparallel coupled across an AP-coupling layer 230. The AP1 and AP2 layers can be, for example, a Co—Fe alloy or some other suitable magnetic material. The coupling layers 230 can be fabricated from, for example, Ru or Ir, and is fabricated with a thickness chosen to strongly antiparallel couple the magnetic moments 234 and 236 of the AP1 and AP2 layers, respectively. The coupling layer can be for example, 2-10 Angstroms thick, or about 8 angstroms thick. The AP1 layer 226 may be exchange coupled with a layer of antiferromagnetic material, AFM layer 232, which strongly pins the magnetic moment 234 of the AP1 layer 226 in a desired direction substantially perpendicular to the ABS. Due to AP coupling of the AP1 and AP2 layers 226 and 228, the AFM layer 232 pins the moment 236 of the AP2 layer 228 in a desired direction substantially perpendicular to the ABS, but antiparallel with the moment 234 of the AP1 layer 226.

A seed layer 238 may be provided at the bottom of the sensor stack 202 to promote a desired grain structure on the subsequently deposited sensor layers. In addition, a capping layer 240, such as Ta, may be provided to protect the layers of the sensor stack 202 from damage during manufacture.

With reference still to FIG. 2, the hard magnetic bias layers 208, 210 may be fabricated from a magnetic material having a high coercivity of 1.5 kOe or higher, preferably $Co_{1-x}Pt_x$ or $Co_{1-x-y}Pt_xCr_y$, x being between 10 and 35 atomic % and y between 0 and 15 atomic %. The seed layers 212, 214 may be fabricated from, for example, Cr or a Cr—X alloy (X=Mo, Ti, V) that produce a crystalline texture, i.e. a preferred crystallographic orientation, in overlayers of magnetic materials such as $Co_{1-x}Pt_x$ or $Co_{1-x-y}Pt_xCr_y$ that are deposited thereon, thereby further increasing the overlayer's coercivity. The magnetic hard-bias layers have magnetic moments that are set substantially parallel to the ABS in order to bias the moment 221 of the free layer in a desired direction substantially parallel with the ABS.

The free layer 220 has a surface 223 that has been treated to have an anisotropic surface texture, or roughness. The treatment and resulting anisotropic surface texture, or roughness, are described below with reference to FIGS. 5A-5D. The treatment of the surface 223 (described in greater detail below) of the free layer 220 is performed at such an angle that the anisotropic surface texture, or roughness, will be oriented in such a manner to cause the free layer to have a magnetic anisotropy with easy axis of magnetization 225 oriented substantially parallel with the air-bearing surface (ABS) as desired. Here, and in the following, the term, magnetic anisotropy axis, is identified as the easy axis of magnetization, also known in the art as the magnetic easy axis. In the present case this means that the easy axis of magnetization will be oriented substantially parallel to the ABS. The magnetic anisotropy of the free layer with easy axis of magnetization 225 greatly assists the biasing robustness of the free layer 220, and is completely additive to the biasing provided by the hard-bias layers 208, 210.

With reference still to FIG. 2, one or both of the AP1 and AP2 layers 226, 228 can have surfaces 227, 229 that are treated to produce an anisotropic texture, or roughness, that induces magnetic anisotropies with easy axes of magnetization 231, 233 substantially perpendicular to the ABS as desired. This surface treatment is performed at such an angle that the anisotropic texture, or roughness, will be oriented in such a manner to cause the magnetic anisotropies with easy axes of magnetization 231, 333 to be oriented in a direction substantially perpendicular to the ABS as desired.

It should be pointed out that either or both of the free 220 and pinned-layer structure 222 can be treated as described to have an anistropic surface texture, or roughness. If both the free layer 220 and pinned-layer structure 222 are treated as described, the present invention advantageously allows the anisotropies of the free layer and pinned layers with easy axes of magnetization 225, 231, 233, respectively, to be set in different directions as necessary.

It should also be pointed out that, after removing a given amount of material, the strengths of the magnetic anisotropies of the individual layers with easy axes of magnetization 225, 231, 233 are inversely proportional to the remaining thickness of the layer being treated. Therefore, if a stronger magnetic anisotropy is needed, multiple treated layers may be deposited. For example, if the free layer 220 is too thick to have a sufficiently strong magnetic anisotropy with easy axis of magnetization 225, a first layer may be deposited, then treated as described, and then a second layer can be deposited and treated. The number of layers can be increased, and their individual thickness decreased, as needed to achieve a sufficiently strong magnetic anisotropy.

Figure 3:
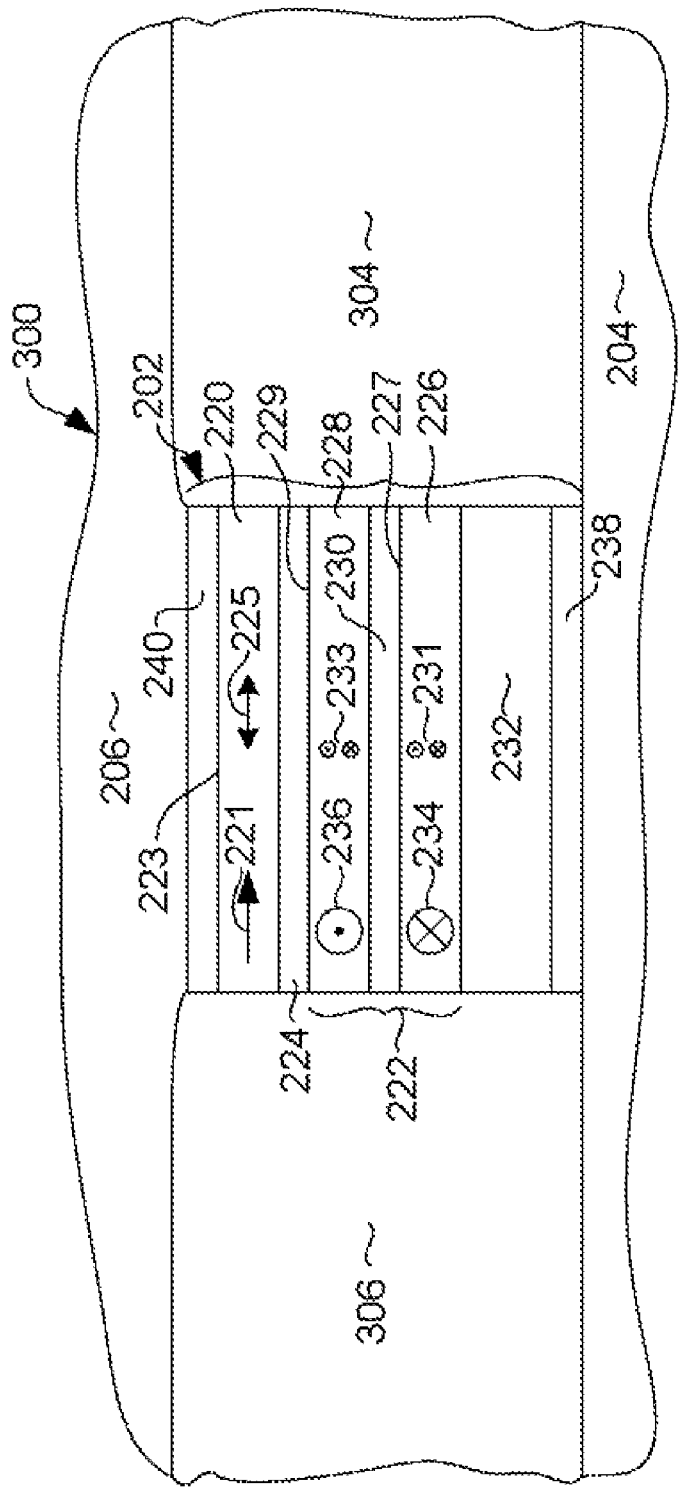
FIG. 3 is an ABS view of a sensor according to another embodiment of the invention.

With reference now to FIG. 3, a sensor 300 according to another embodiment of the invention includes a sensor stack 202, sandwiched between first and second gap layers 204, 206. As with the previously described embodiment, the sensor 300 includes a free layer 220, a pinned-layer structure 222, and a nonmagnetic spacer layer 230. Also, as with the previously described embodiments, the free layer 220 has a surface 223 that is configured with an anisotropic surface texture that induces a strong magnetic anisotropy with easy axis of magnetization 225 in the free layer in a direction substantially parallel with the ABS. One or more of the magnetic layers 226, 228 of the pinned-layer structure may also have a surface configured with an anisotropic texture 227, 229 that induces strong magnetic anisotropies with easy axes of magnetization 231, 233 in a direction substantially perpendicular to the ABS. The magnetic moment of the free layer 220 is maintained in a biased state parallel with the ABS by the strong magnetic anisotropy with easy axis of magnetization 225 provided by the surface texture 223. Since the free layer is biased by its magnetic anisotropy with easy axis of magnetization 225, the bias layers 208, 210 provided in the previously described embodiment (FIG. 2) are not needed in the embodiment described here in FIG. 3. Therefore, the areas outside of the sensor stack 202, between the first and second gap layers 204, 206 may be filled with a nonmagnetic, electrically conductive lead material 304, 306, such as Au, Rh, Cu or some other suitable material. Alternatively, the areas outside of the sensor stack 202, i.e. extending laterally beyond the sides of the sensor stack 202, may include a combination of fill material such as alumina and an electrically conductive lead material.

Figure 4:
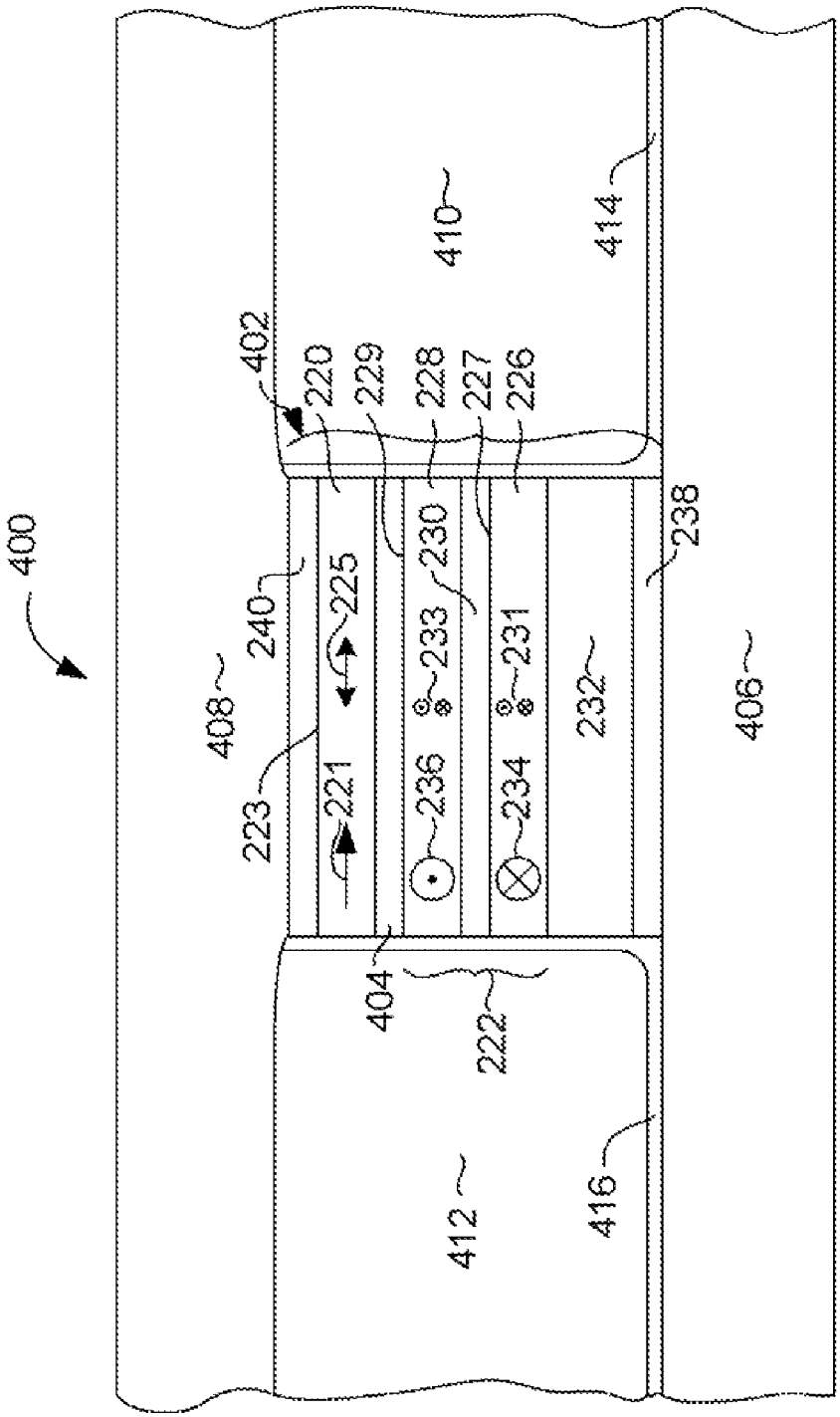
FIG. 4 is an ABS view of a sensor according to another embodiment of the invention.
Figure 5A:
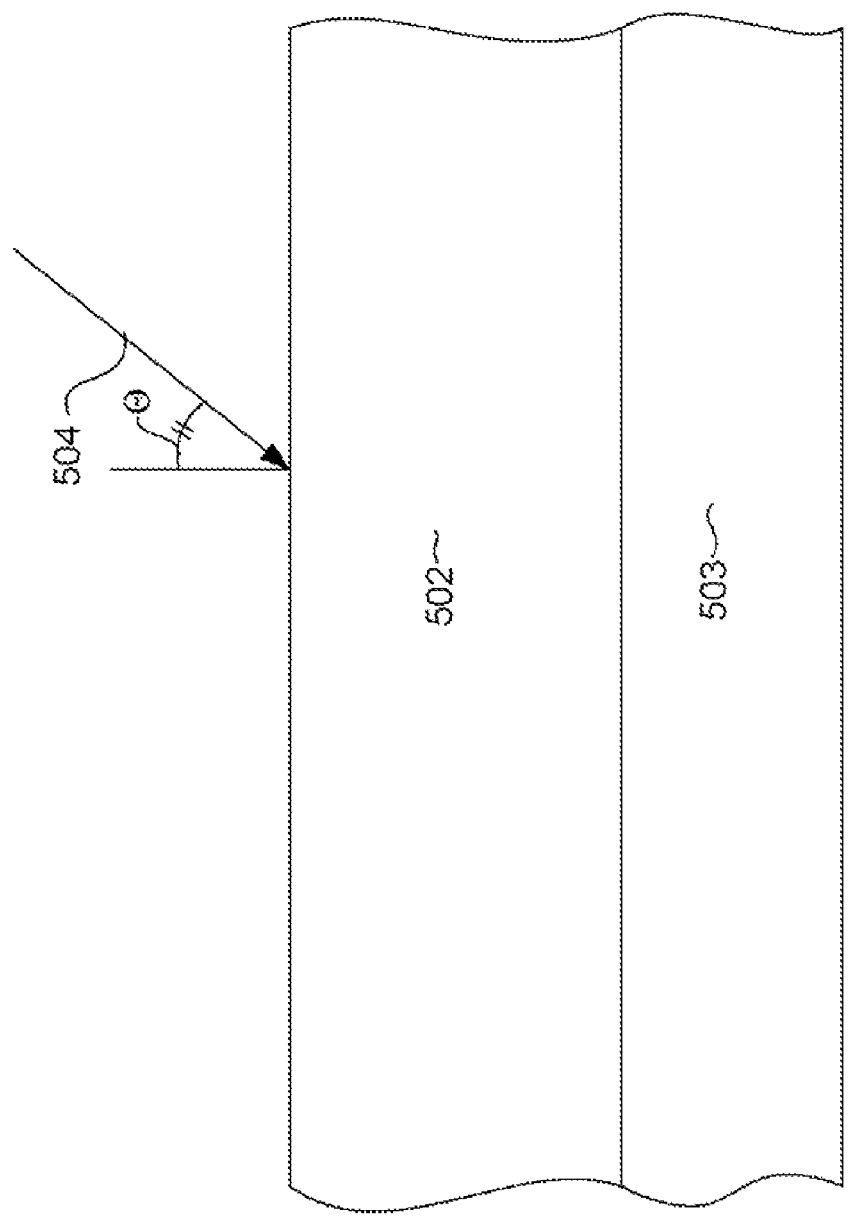
FIGS. 5A through 5D are cross-sectional views illustrating a method of setting a magnetic anisotropy in a magnetic layer according to the present invention.
Figure 5B:
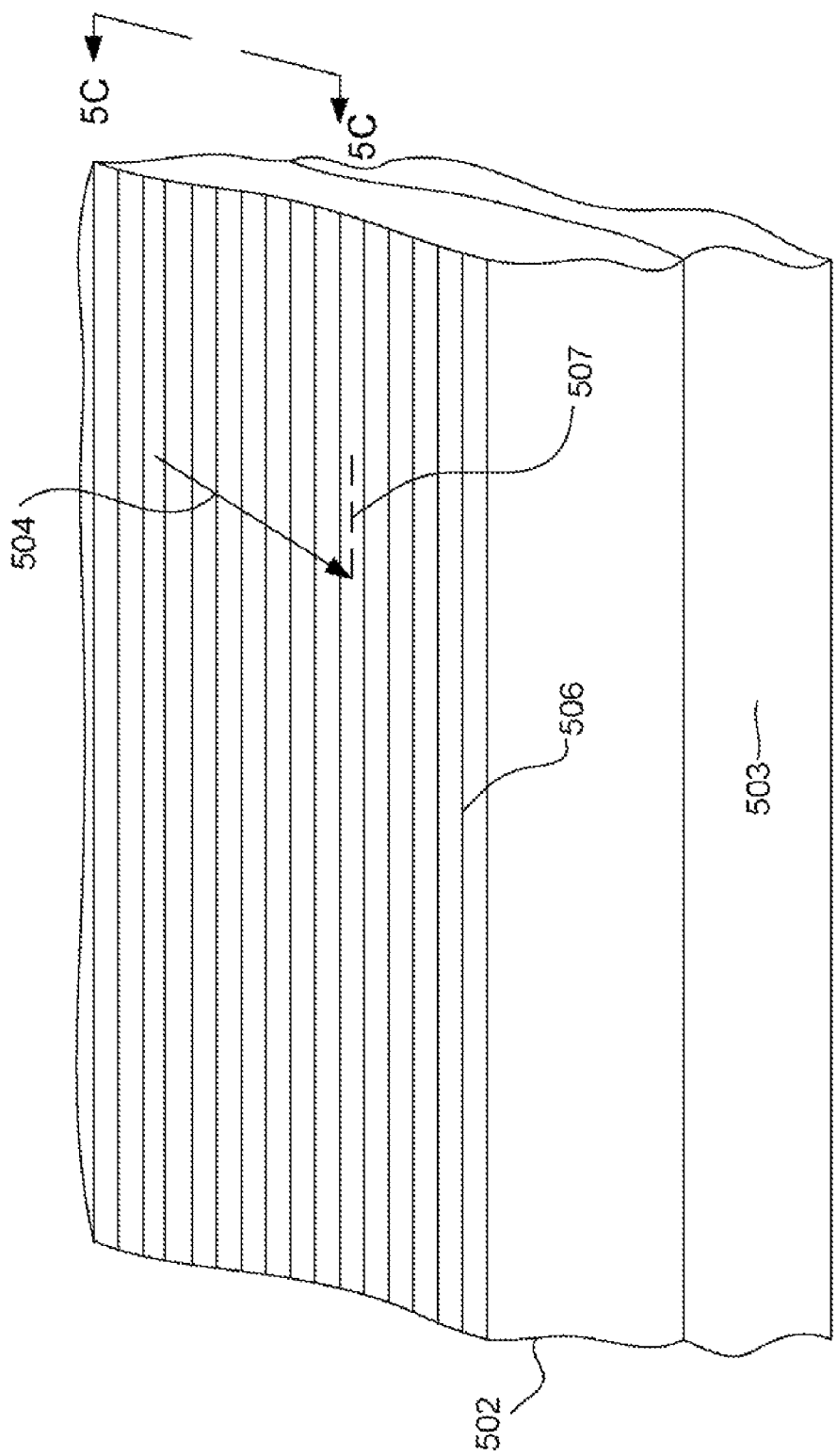
Figure 5C:
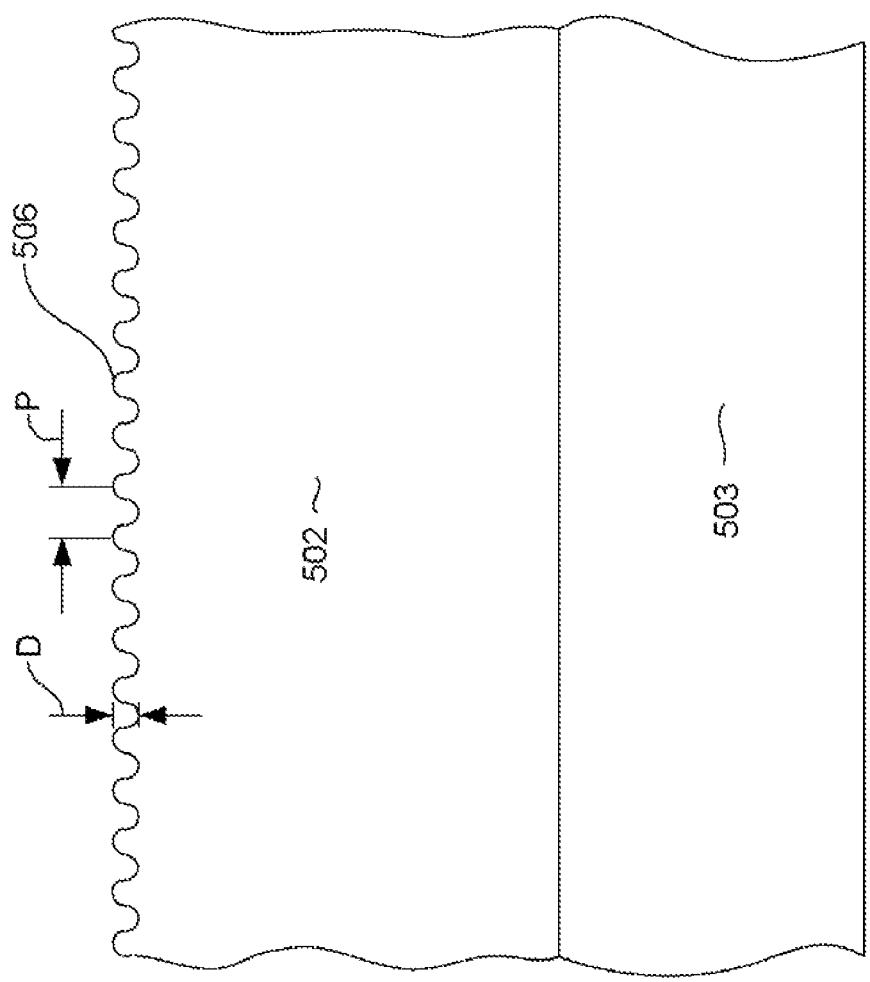
Figure 5D:
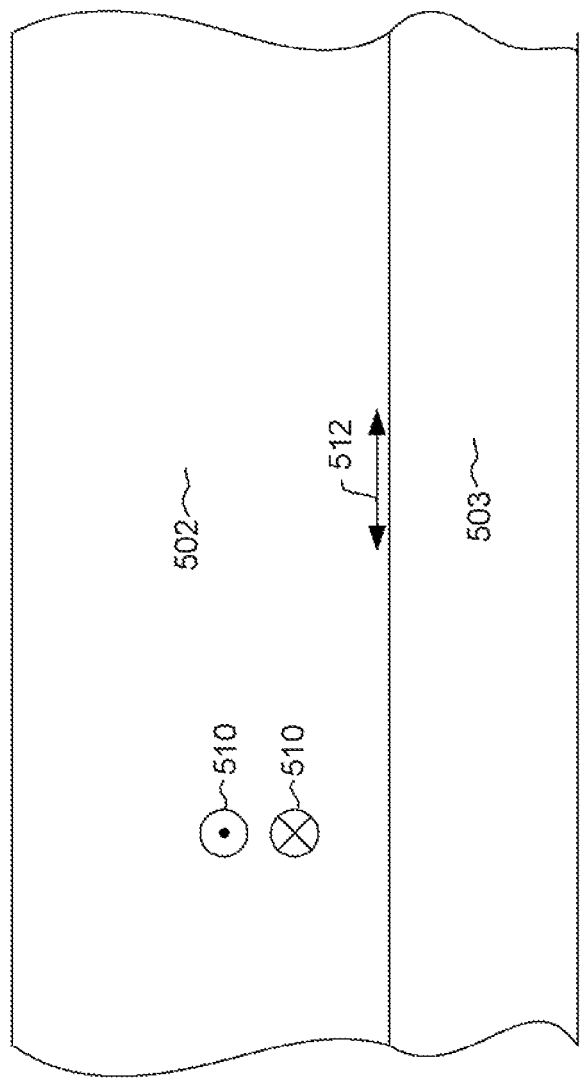

With reference to FIG. 4, another embodiment of the invention includes a current-perpendicular-to-plane (CPP) sensor 400 that includes a sensor stack 402 having a free layer 220, a pinned-layer structure 222, and a nonmagnetic layer 404 sandwiched between the free layer 220 and the pinned-layer structure 222. The sensor 400 can be a current-perpendicular-to-plane, tunneling magnetoresistive (CPP-TMR) sensor, also known as a tunnel valve (TV) or magnetic tunnel junction (MTJ) sensor, or other current-perpendicular-to-plane, giant magnetoresistive (CPP-GMR) sensor, such as a current-perpendicular-to-plane, spin-valve (CPP-SV) sensor. If the sensor 400 is a tunnel valve, the nonmagnetic layer 404 is a thin, nonmagnetic, electrically insulating barrier layer 404, such as aluminum oxide ($AlO_x$), magnesium oxide ($MgO_x$), or titanium oxide ($TiO_x$), (where the subscript, x, indicates that the oxide need not be stoichiometric, but does not preclude a stoichiometric oxide such as alumina ($Al_2O_3$)). If the sensor 400 is not a tunnel valve, i.e. not a CPP-TMR sensor, then the nonmagnetic layer 404 is an electrically conductive spacer layer, such as Cu.

The sensor stack 402 is sandwiched between first and second electrically conductive leads 406, 408, which may be fabricated from a magnetic material such as a Ni—Fe alloy so that they may function as magnetic shields, as well as leads. The free layer 220 has a surface 223 configured with an anisotropic texture that induces a magnetic anisotropy with easy axis of magnetization 225 substantially parallel with the free layer. First and second hard magnetic bias layers 410, 412 may be provided at either side of the sensor stack 402 to bias the moment 221 of the free layer 220. The bias layers 410, 412, may be fabricated from a material such as a Co—Pt alloy or a Co—Pt—Cr alloy, and are insulated from the sensor stack 402 and at least one of the shields/leads 406 by insulation layers 414, 416, which may be fabricated from, for example, alumina and which may be conformally deposited by a technique such as chemical vapor deposition (CVD) or atomic layer deposition (ALD). The insulation layers 414, 416 prevent current from being shunted through the hard-bias layers 410, 412. Optionally, the hard-bias layers 410, 412 can be omitted, and biasing of the moment 221 of the free layer 220 can be maintained solely by the magnetic anisotropy with easy axis of magnetization 225 provided by the surface texture 223.

It should be pointed out that, although the pinned-layer structure 222, described with reference to FIGS. 2, 3 and 4 is described as being pinned by exchange coupling with an AFM layer 232, this AFM layer 232 could be eliminated from any one of these embodiments. In that case, pinning of the moments 234, 236 of the pinned-layer structure 222 can be maintained by a combination of AP coupling between the AP1 and AP2 layers 226, 228, positive magnetostriction of the AP1 and AP2 layers 226, 228, and the magnetic anisotropies with easy axes of magnetization 231, 233 provided by anisotropic texturing of the surfaces 227, 229.

The free layer 220 described with reference to FIGS. 2, 3 and 4 can be fabricated from, for example, Co, a Co—Fe alloy, a Ni—Fe alloy or a combination of these materials. The AP1 and AP2 layers 226, 228 of the pinned-layer structure 222 described with reference to FIGS. 2, 3, and 4 can be fabricated from, for example, a Co—Fe alloy or some other suitable magnetic material. It should be pointed out that the use of surface treated magnetic layers in a magnetoresistive device applies to any magnetic layer of any type of magnetoresistive sensor, memory cell, or magnetic device of any structure, including current-in-plane, giant magnetoresistive sensor (CIP-GMR) sensors, current-perpendicular-to-plane, tunneling-magnetoresistive (CPP-TMR) sensors, also known as tunnel valves, current-perpendicular-to-plane, giant magnetoresistive sensor (CPP-GMR), dual sensors, spin-accumulation sensors, magnetic transistors, MRAM, etc.

As described above, in a free layer of the surface-texture-induced, magnetic anisotropy can be used in place of hard-bias layers or can be used in conjunction with such hard-bias layers. In addition, the surface-texture-induced, magnetic anisotropy can be used in conjunction with and additive to any other biasing structure, such as in-stack bias or direct-orthogonal, exchange biasing, further enhancing the bias effect on the free layer.

In addition, the anisotropic-texture-induced, magnetic anisotropy in a free layer can be practiced in a sensor having an AP-coupled free layer, also known as a synthetic free layer. Such a structure includes two or more magnetic layers separated by and antiparallel coupled across a nonmagnetic coupling layer, which can be, for example, Ru. All of the magnetic layers can each be treated as described, or alternatively, fewer than all of the magnetic layers, for example, just a single one of the magnetic layers.

Anisotropic Texturing of a Magnetic Layer for Inducing a Magnetic Anisotropy in the Magnetic Layer With reference to FIGS. 5A through 5D, a magnetic material 502 is deposited over a substrate 503. The magnetic layer can be, for example, a free layer 220 (FIGS. 2, 3 or 4) an AP1 or AP2 layer 226, 228 (FIGS. 2, 3 or 4) or some other magnetic layer in a magnetoresistive sensor, a magnetic write head, a magnetic recording medium, a magnetic electrode of a magnetic random access memory (MRAM) cell, or some other devices. The magnetic material 502 can be, for example, 30 to 300 Angstroms, or about 100 Angstroms thick, after ion milling. An ion milling, or etching, is then performed by directing an ion beam 504 at an angle Θ with respect to a normal to the surface of the magnetic layer 502. The angled ion milling, or etching, induces an anisotropic surface texture, or roughness, for example, in the form of oriented ripples, or facets 506, that run in a direction substantially parallel or substantially perpendicular to the in-plane projection 507 of the ion beam 504 onto the surface of the layer 502. The typical or average pitch P of the ripples 506 may be between 10-200 nm, and their average depth D may be between 0.5 to 5 nm or about 1 nm.

An easy axis of magnetization 510 of the magnetic layer 502 will be generated by the anisotropic texture. Depending on the material composition and other factors such as the ion beam energy and substrate temperature, the easy axis of magnetization may be either perpendicular or parallel to the direction 512 of the ripples, and substantially perpendicular or parallel to the in-plane projection 506 (FIG. 5B) of the angled ion beam onto the surface of the underlayer 502. Therefore, the ion-milling direction must be chosen such that the resulting easy axis of magnetization of the magnetic layers is in the proper, desired direction, such as substantially parallel with the ABS for a free layer or in-stack bias layer, or substantially perpendicular to the ABS for a pinned layer.

The angled ion beam 504 is preferably oriented at an angle of between 20 and 80 degrees and is more preferably oriented at an angle of between 35 and 65 degrees with respect to the normal to the surface of the underlayer 502. The exact voltage, current, and angle conditions depend on the type and characteristics of the ion source in use. Typically, a low ion beam energy such as 80 to 120 eV or about 100 eV is employed.

The initial thickness of the layer 502 and the milling time and energy are chosen to result in a final magnetic layer 502 having a desired final thickness.

End-Point Detection For Direct Ion Milling to Induce Magnetic Anisotropy

In order to optimize the effectiveness of the direct ion-milling method described above, it is important to carefully control the resulting final thickness upon completion of ion milling. The final thickness of the magnetic layer, not only affects the efficacy of the resulting magnetic anisotropy, but also affects the performance of the magnetic layer for its intended function. For example, the thickness of a free layer is very important to the performance of the free layer. As can be appreciated, the direct ion milling removes material from the magnetic layer, and the longer the duration of ion milling and the greater the energy of the ion beam, the greater the amount of material removed.

Figure 6:
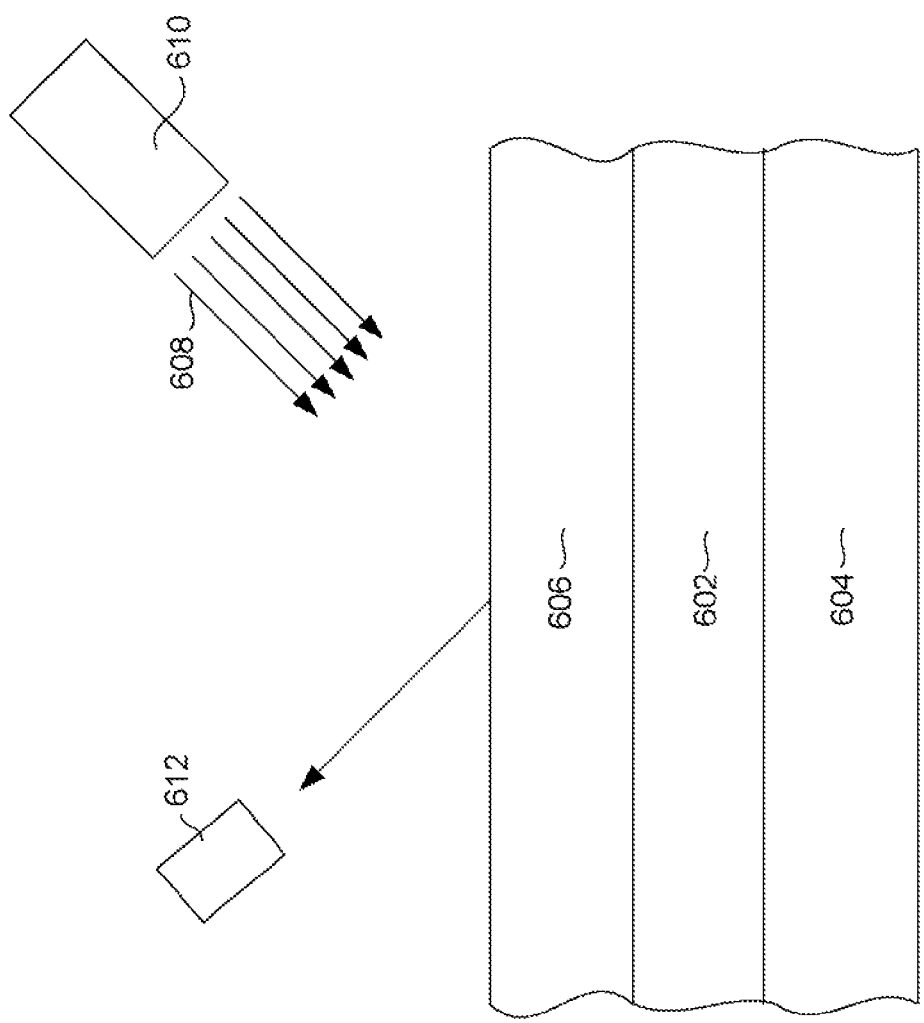
FIG. 6 is a schematic illustration describing an ion-milling, end-point detection method according to an embodiment of the invention.

With reference to FIG. 6, a novel end-point detection method is described for determining at what point the ion milling should terminate in order to produce a magnetic layer having a desired final thickness. The magnetic film can be deposited substantially to its desired final thickness, or possibly slightly thicker. A magnetic layer 602 is deposited onto a substrate 604, which can be any form of underlayer. A sacrificial film 606 is deposited over the magnetic layer 602. This sacrificial film 606 is preferably fabricated from a different material than the magnetic layer 602.

A stationary angled ion beam 608 performs an ion milling, using an ion source 610 in order to remove sufficient sacrificial layer material to create an anisotropic surface texture, or roughness, on its surface. An end-point, or etch, detector 612, such as SIMS (Secondary Ion Mass Spectrometer) detects material removed by the ion beam 608. As the sacrificial layer 606 is being removed by the ion beam 608, the end-point detector will detect material from the sacrificial layer. When the ion beam 608 has sufficiently removed the sacrificial layer 606, i.e. the magnetic layer 602 has been reached, then the end-point detector 612 will begin to detect material making up the magnetic layer 602. When the latter event occurs, it indicates that ion milling can be terminated. The sacrificial layer 606 material is chosen experimentally to create the most favorable anisotropic surface texture, or roughness, by ion milling. Any anisotropic surface texture, or roughness, from the sacrificial layer 606 will be transferred into the magnetic layer 602.

Figure 7:
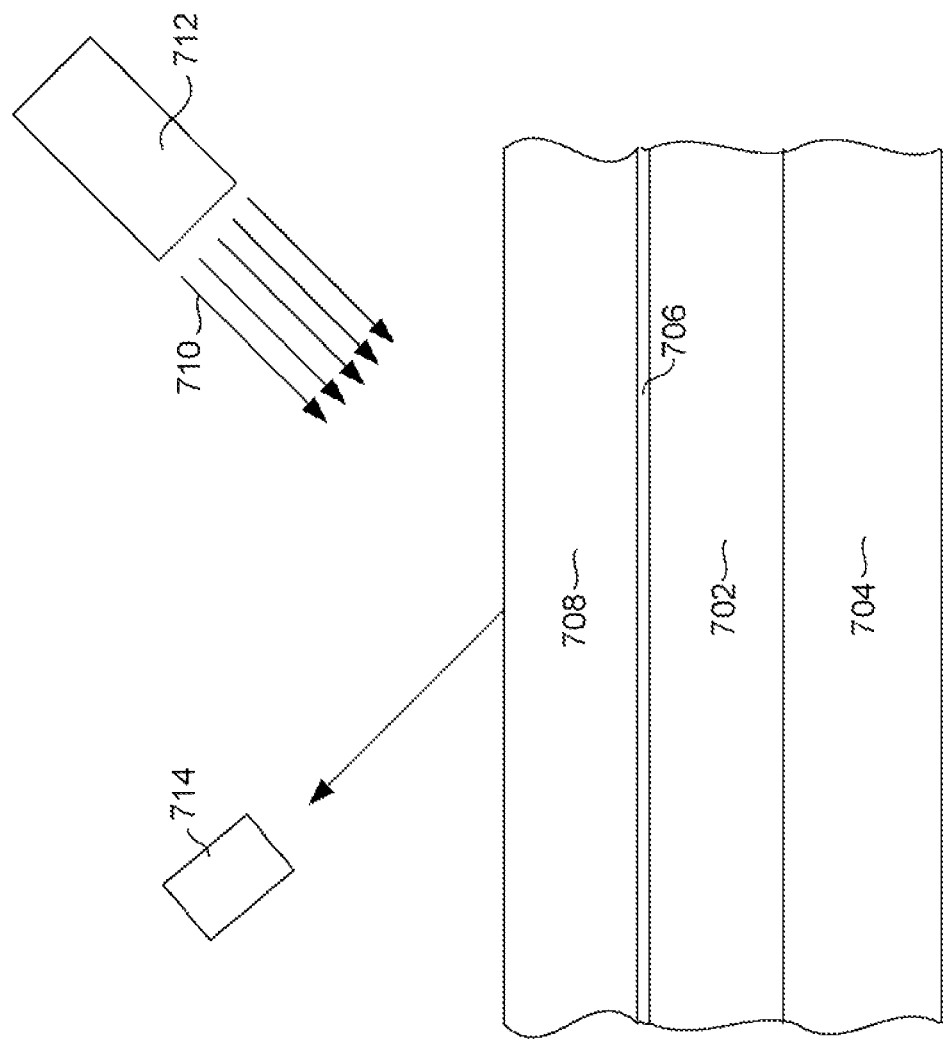
FIG. 7 is a schematic illustration describing an ion-milling, end-point detection method according to another embodiment of the invention.

With reference to FIG. 7, in an alternative embodiment of the invention, a magnetic layer 702 is deposited on a substrate 704, the substrate can be any layer such as a spacer layer, a pinned-layer seed layer, a Ru AP-coupling layer, or any other layer that might be present under a magnetic layer that would benefit from the described surface treatment. A thin indicator layer 706 is deposited on the magnetic layer 702, and a sacrificial layer 708 may be deposited on the indicator layer. A stationary ion beam 710 is provided by an ion source 712, and an end-point detector 714 is provided for detecting the material being removed by the ion beam 710 at any give time.

The role of the indicator layer 706 is to indicate when ion milling needs to be stopped. The detection of the indicator layer 706 can be achieved, for example, by using SIMS or another in-situ detection technique. If a sufficiently slow-etching indicator material, i.e. slow in comparison with the sacrificial or magnetic layer material, is chosen, then the indicator layer 706 can also act as a milling stop to improve milling uniformity. The materials of the sacrificial layer 708 and indicator layer 706 are chosen experimentally to create the most favorable anisotropic surface texture, or roughness, by ion milling. This anisotropic surface texture, or roughness, is then transferred into the magnetic layer for maximum magnetic anisotropy. The sacrificial material 708 does not remain in the final sensor. The indicator material 706 may, or may not, remain in the final sensor as needed. The indicator layer 706 may be used to simply indicate the end point of the process, or may be used to indicate a point at which milling parameters may be adjusted to finish the process.

For example, the magnetic layer 702 may be Ni, Fe, Co or their alloys; the indicator Layer 706 may be one of Ta, Ru, Pt, Cr, Pd, Ti, Al; the sacrificial layer 708 may be one of Ru, Ta, Au, Cu, Ag. The magnetic film may be a magnetic layer in a magnetic sensor or other magnetic device in which a uniaxial magnetic anisotropy can improve the performance of the device. The direction of the ion milling with respect to the substrate is chosen to create the appropriate anisotropic surface texture, or roughness, which induces a magnetic anisotropy with an easy axis of magnetization in layer 702 that is substantially parallel to the ABS, in the case of a magnetic free layer or in-stack bias layer, or substantially perpendicular to the ABS, in case of a magnetic pinned layer.

Magnetic Write Head With Magnetically Anisotropic Write Pole

Figure 8:
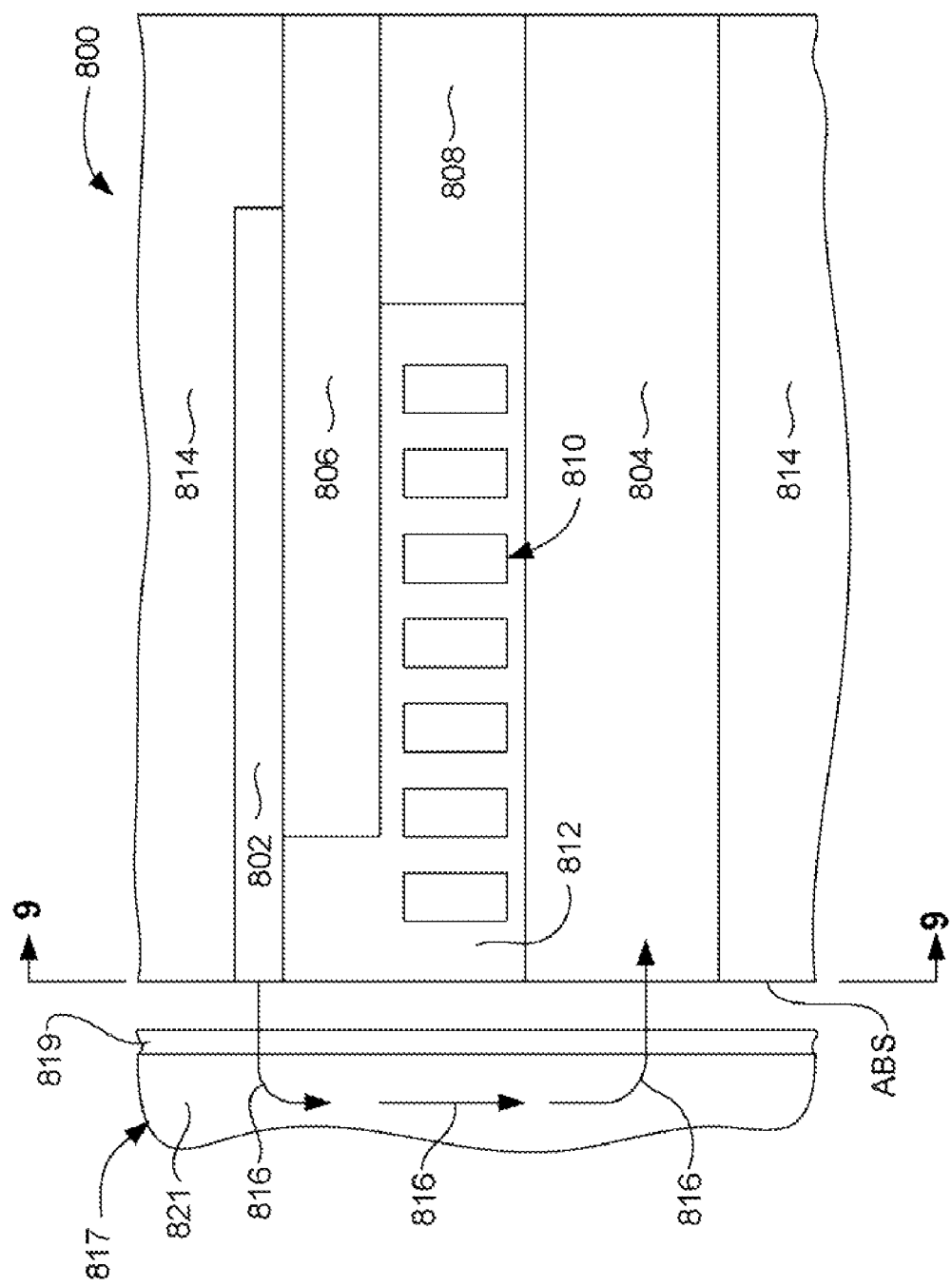
FIG. 8 is a cross-sectional view of a magnetic write head according to an embodiment of the invention.

With reference now to FIG. 8, the present invention can also be embodied in a magnetic write head such as a perpendicular magnetic write head 800. The write head 800 includes a write pole 802, and a return pole 804. The write pole 802 is connected with a magnetic shaping layer 806, and the shaping layer 806 and return pole 804 are connected by a magnetic back-gap layer 808. The return pole 804, back gap 808, and shaping layer 806 can be fabricated from various magnetic materials, such as Ni—Fe alloy, or some other suitable magnetic material. The write pole 802 can be fabricated from various magnetic materials and is preferably fabricated from a material having a low coercivity and a high moment, such as a Co—Fe alloy. The write pole may also be fabricated as a laminate structure, i.e. with many layers of magnetic material separated from one another by thin nonmagnetic layers.

An electrically conductive coil 810 passes between the return pole 804 and the shaping layer 806 and write pole 802. The electrically conductive coil can be fabricated from, for example, Cu and is surrounded by an insulation layer 812, which can be one, or more layers of, for example alumina. The write head 802 may be sandwiched between electrically insulating, nonmagnetic layers 814. The write head 800 has a surface that faces a magnetic recording medium, which also forms a portion of the air-bearing surface or ABS.

Figure 9:
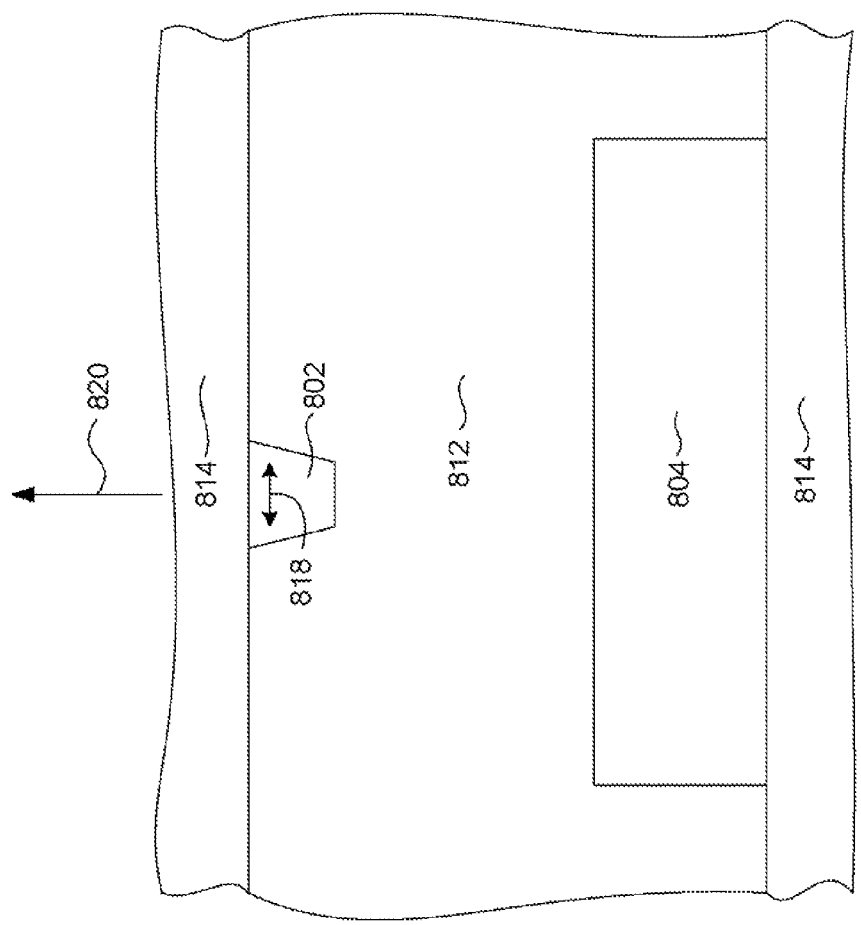
FIG. 9 is an ABS view, taken from line 9-9 of FIG. 8, of the magnetic write head of FIG. 8.

With reference still to FIG. 8, as electrical current flows through the coil 810 (FIG. 9), a magnetic field is induced that results in a magnetic flux flowing through the write pole 802, shaping layer 806, back gap 808 and return pole 804. This flux makes a complete circuit; the write field 816 comprises a high magnetic flux density that emanates from the write pole 802, passes through an adjacent magnetic recording medium 817 writing to the medium by switching its magnetization state, and returns back through the return pole 804 at a density lower than that capable of magnetically switching the medium. In a typical perpendicular recording design, the magnetic recording medium 817 has a thin high coercivity upper, top, layer 819 and a lower coercivity underlayer 821. With reference to FIG. 9, which shows the write head as viewed from the ABS, the write pole 802 has a much smaller cross-sectional area exposed at the ABS than the return pole 804. This means that the magnetic flux density emanating from the write pole 802 is much more concentrated than the magnetic flux density returning through the return pole 804, because the flux at the return pole 804 is much more spread out over the larger surface area of the return pole exposed at the ABS. Therefore, the magnetic flux density from the write pole is sufficiently strong to magnetize, i.e. switch the magnetic state of, the thin, high coercivity to layer, but is weak enough at the return pole so as not to pose any danger of erasing the magnetic transition previously written by the write pole to that top layer of the magnetic recording medium. It can also be seen with reference to FIG. 9 that the write pole 802 can be fabricated with a trapezoidal shape. This shape is helpful in avoiding adjacent track writing when the magnetic head is skewed at an angle, as is the case when the head is at extreme outer or inner radii of a magnetic disk including the magnetic recording medium during use.

With continued reference to FIG. 9, the write pole 802 has a magnetic anisotropy with a laterally oriented easy axis of magnetization 818 such that the easy axis is oriented perpendicular to a track direction 820 and parallel with the ABS, and thus, with the surface of a magnetic recording medium during use (magnetic recording medium not shown). As those skilled in the art will appreciate, during use, the direction of magnetization of the write pole alternates between being directed into, or out of, the ABS, i.e. perpendicularly directed into, or out of, the plane of the figure in FIG. 9. A write pole having an easy axis of magnetization that is oriented parallel with the ABS, i.e. parallel with the plane of the figure in FIG. 9, increases the speed at which the magnetization of the write head can change orientation from being directed perpendicularly into, or out of, the ABS. Therefore, a write pole having an easy axis of magnetization 818 oriented as described above greatly increases writing speed and efficiency.

Perhaps more importantly, the easy axis of magnetization 818 prevents the write pole 802 from inadvertently writing to the magnetic recording medium, which would cause unacceptable signal noise and loss of data. As can be seen with reference to FIGS. 8 and 9, the write pole has a long narrow shape. This causes a shape-induced magnetic anisotropy with easy axis of magnetization in an undesired direction, perpendicular to the ABS. Were it not for the intentionally created magnetic anisotropy with easy axis of magnetization 818 parallel with the ABS, this shape-induced anisotropy having its easy axis of magnetization perpendicular to the ABS would cause the write pole 802 to be magnetized either into, or out of, the ABS in a quiescent state, i.e. a state without a signal-generating current flowing through coil 810. As can be appreciated then, the shape-induced magnetic anisotropy can cause the write pole 802 to write to a magnetic recording medium even when it is not desired. The presence of the intentionally generated magnetic anisotropy with easy axis of magnetization 818 prevents this inadvertent writing maintaining the magnetization of the write pole 802 in a neutral state when current is not flowing through the coil. Methods for fabricating a write pole 802 to have such a magnetic anisotropy with easy axis of magnetization 818 according to embodiments of the invention are described herein below.

Figure 10:
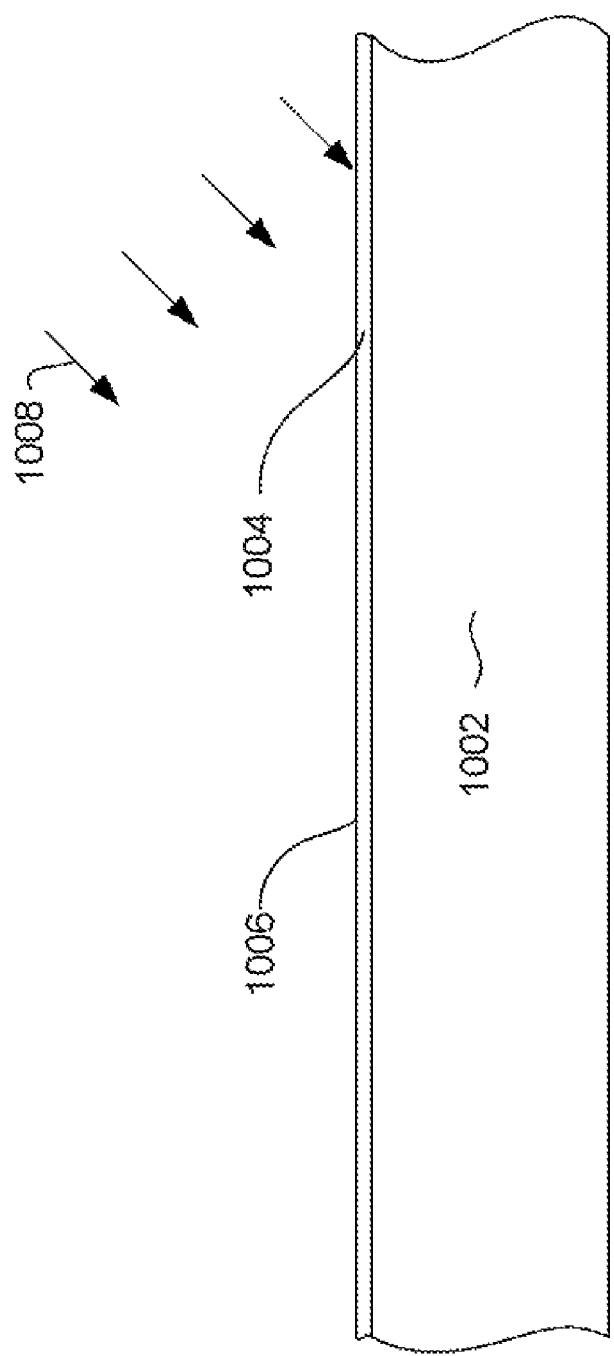
FIGS. 10-14 are views of a magnetic write head in various intermediate stages of manufacture, illustrating a method of fabricating a magnetic write pole according to an embodiment of the invention.

With reference to FIGS. 10 through 14, methods for fabricating a magnetic write pole having a magnetic anisotropy with an easy axis of magnetization in a desired direction are described. With particular reference to FIG. 10, a substrate 1002 is provided, which may be, for example, the insulation layer 812 and shaping layer 806 described in FIGS. 8 and 9, both of which have been planarized to have smooth flat coplanar surfaces. An electrically conductive seed layer 1004 is deposited over the substrate 1002. The seed layer has a surface 1006 and can be fabricated with a magnetic material similar to the write pole material, or could be a nonmagnetic electrically conductive material.

With continued reference to FIG. 10, an angled, direct ion beam 1008 performs an angled ion milling to form an anisotropic texture, or roughness, in the surface 1006 of the seed layer 1004. The ion milling and resulting anisotropic surface texture, or roughness, are described in greater detail with reference to FIGS. 5A through 5D.

Figure 11:
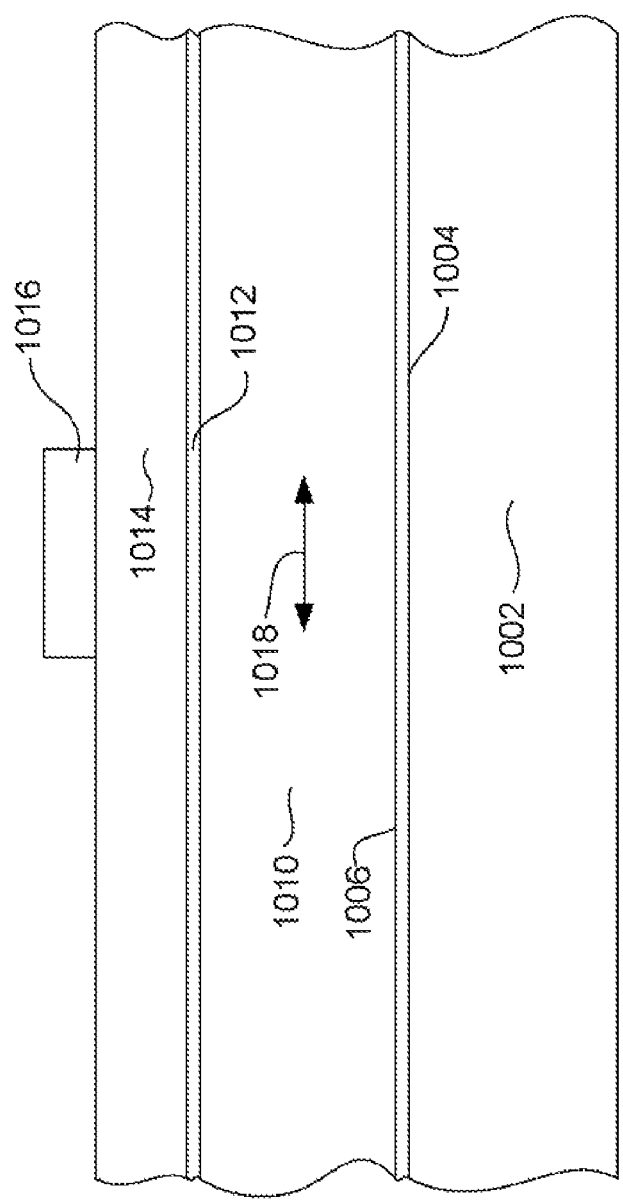

With reference to FIG. 11, a layer of magnetic material 1010 is deposited over the seed layer 1004. The magnetic material 1010 can be, for example, a Co—Fe alloy, or some other magnetic material. A thin layer of hard mask material 1012 is then deposited over the magnetic layer 1010. The hard mask layer 1012 can be, for example, alumina ($Al_2O_3$), $SiO_2$, diamond like carbon (DLC), etc. An image transfer layer 1014, such as DURIMIDE® can be deposited over the hard mask 1014. A photosensitive mask layer 1016, such as photoresist, is then deposited over the image transfer layer 1014, and is photolithographically patterned to have a width that is chosen to define a magnetic write width, or magnetic core width (MCW), of the write pole 802 (FIGS. 8 and 9), corresponding to the track width written to the magnetic recording medium.

The anisotropic texture, or roughness, of the surface 1006 of the seed layer 1004 produces an easy axis of magnetization 1018 in the magnetic pole material layer 1010. The magnetic anisotropy and associated easy axis of magnetization are described in greater detail in FIGS. 5A through 5D. As described above, the effect of the anisotropic surface texture, or roughness, in generating magnetic anisotropy is inversely proportional to the remaining thickness of the layer being treated, after a given amount of material has been removed. Therefore, if a greater magnetic anisotropy with easy axis of magnetization 1018 is needed, the magnetic layer 1010 can be deposited in several stages by depositing a portion of the magnetic layer 1010, performing an angled ion milling, depositing some more magnetic layer 1010, performing another angled ion milling, wherein each ion milling is preferably performed at low incident ion energy, or for a short time, as was described in FIGS. 5A through 5D, and repeating these steps until the structure is completely fabricated. Such a series of repeated angled ion milling can greatly increase the amount of magnetic anisotropy in the write pole 802.

Figure 12:
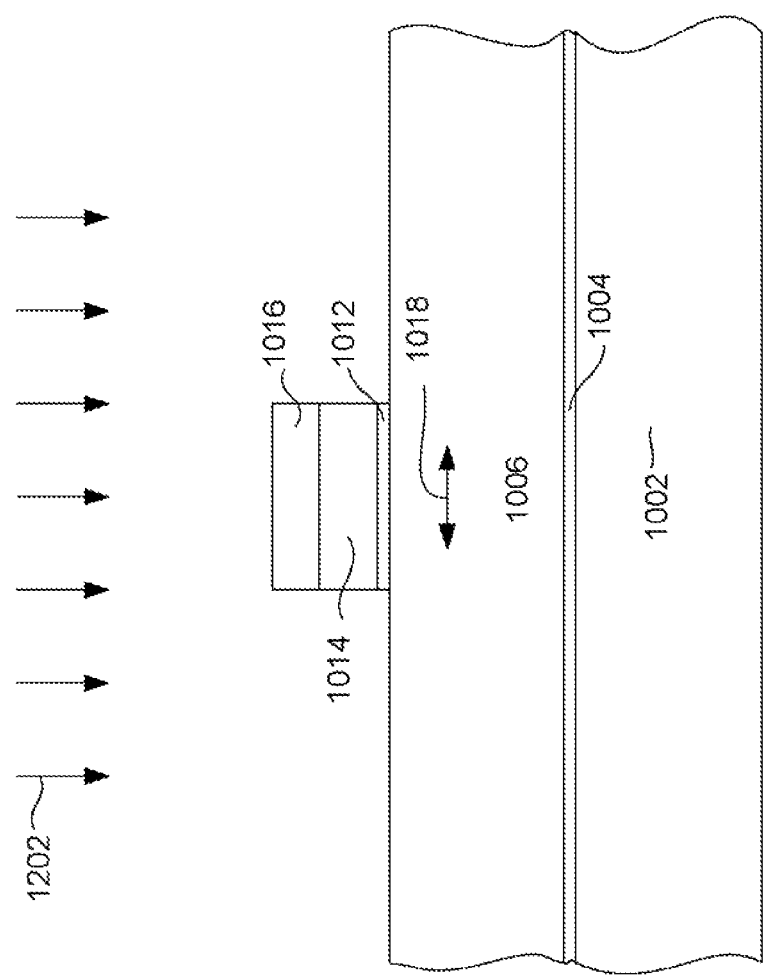
Figure 13:
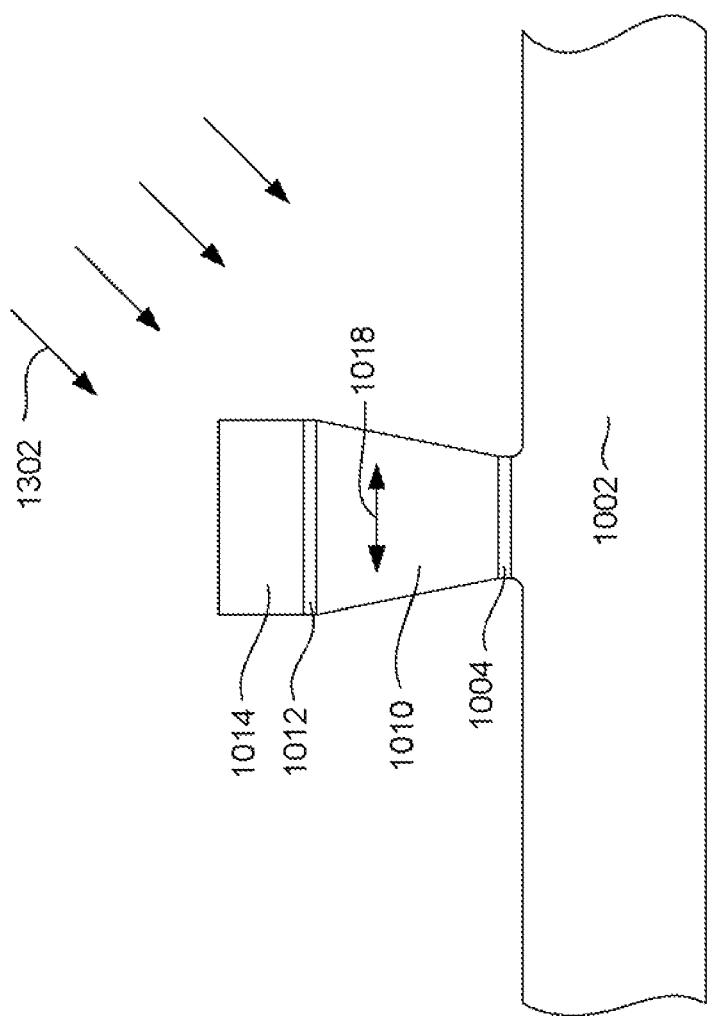

With reference now to FIG. 12, a reactive ion beam 1202 performs a reactive ion etching (RIE) to transfer the image of the photoresist mask 1016 into the underlying image transfer layer 1014 and the hard mask layer 1012 by removing material not protected by the photo mask 1016. Then, with reference to FIG. 13, an ion beam 1302 performs an ion milling to remove portions of the magnetic layer 1010 that are not protected by the hard mask 1012, thereby forming the write pole 802 described in FIGS. 8 and 9. The ion milling is preferably performed from two sides at an angle with respect to the normal to the surface of the wafer in order to create a write pole having the desired trapezoidal shape discussed with reference to FIG. 9. During ion milling, the ion beam 1302 removes the photoresist layer 1016 (FIG. 12) and also likely removes a portion of the image transfer layer 1014. After the write pole 802 has been formed, an insulation material can be deposited, and the remaining mask layers 1012, 1014 can be removed.

Figure 14:
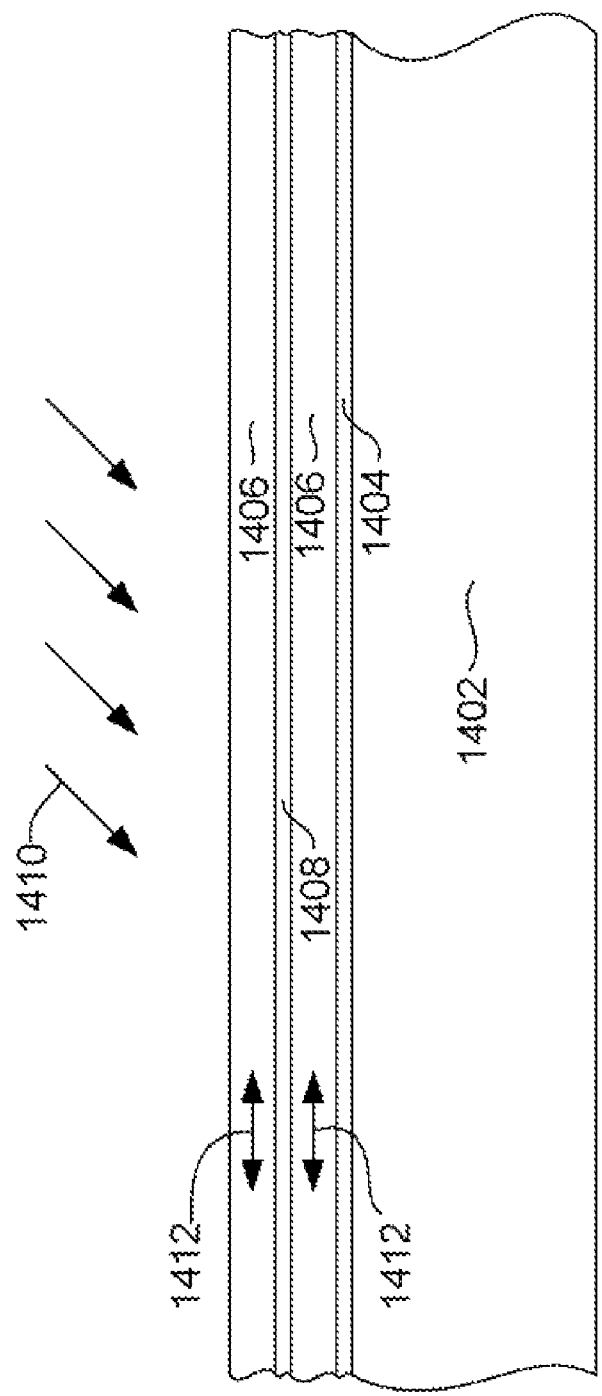

With reference now to FIG. 14, in another similar embodiment of the invention, a multi-layer, laminated write pole can be formed. A substrate 1402 is provided, and an electrically conductive seed layer 1404 is deposited over the substrate 1402. Then a series of magnetic layers 1406, alternating with thin, nonmagnetic layers 1408 are deposited. The magnetic layers can be fabricated from, for example, a Co—Fe alloy, and the thin, nonmagnetic layers can be fabricated from, for example Cr, a Ni—Cr alloy, Rh, Ru, Ta, or alumina ($Al_2O_3$). The magnetic layers 1406 can each have a thickness of, for example, 100-500 Å, and the nonmagnetic layers 1408 can each have a thickness of, for example, 5-30 Å. Fabricating the magnetic write pole material as a laminated structure of magnetic layers 1406 separated by thin nonmagnetic layers 1408 prevents the formation of magnetic domains, and significantly improves magnetic performance.

After depositing a magnetic layer 1406, the surface of the magnetic layer 1406 is treated with a low-energy angled ion beam 1410 in an angled ion milling to create a desired anisotropic surface texture as described in FIGS. 5A through 5D. The surface texture generated by the ion milling is such that it induces a magnetic anisotropy with easy axis of magnetization 1412 in a desired direction, substantially perpendicular to the down track direction and substantially parallel with the ABS.

It should be pointed out that the final deposited structure comprising alternating layers of magnetic material 1406 and nonmagnetic material 1408 will include many such layers. It should also be pointed out that the surface of any number of the magnetic layers 1406 can be treated. For example, only one or a few of the magnetic layers can be treated by the ion beam 1410 during ion milling, or all of the magnetic layers 1406 can be treated depending upon the strength of the magnetic anisotropy needed. Alternatively, or in addition to treating the surfaces of the magnetic layers 1406, the surfaces of the nonmagnetic layers 1408 can be treated with the ion beam 1410 during ion milling to produce an anisotropic surface texture on the nonmagnetic layers 1408. The treated nonmagnetic layers, then become underlayers for the subsequently deposited magnetic layers; and, this treatment of the underlying nonmagnetic layers 1408 also serves to induce a desired magnetic anisotropy in the magnetic layers 1406 deposited thereon.

Magnetic Recording Medium Having a Soft Underlayer With a Magnetic Anisotropy

Figure 15:
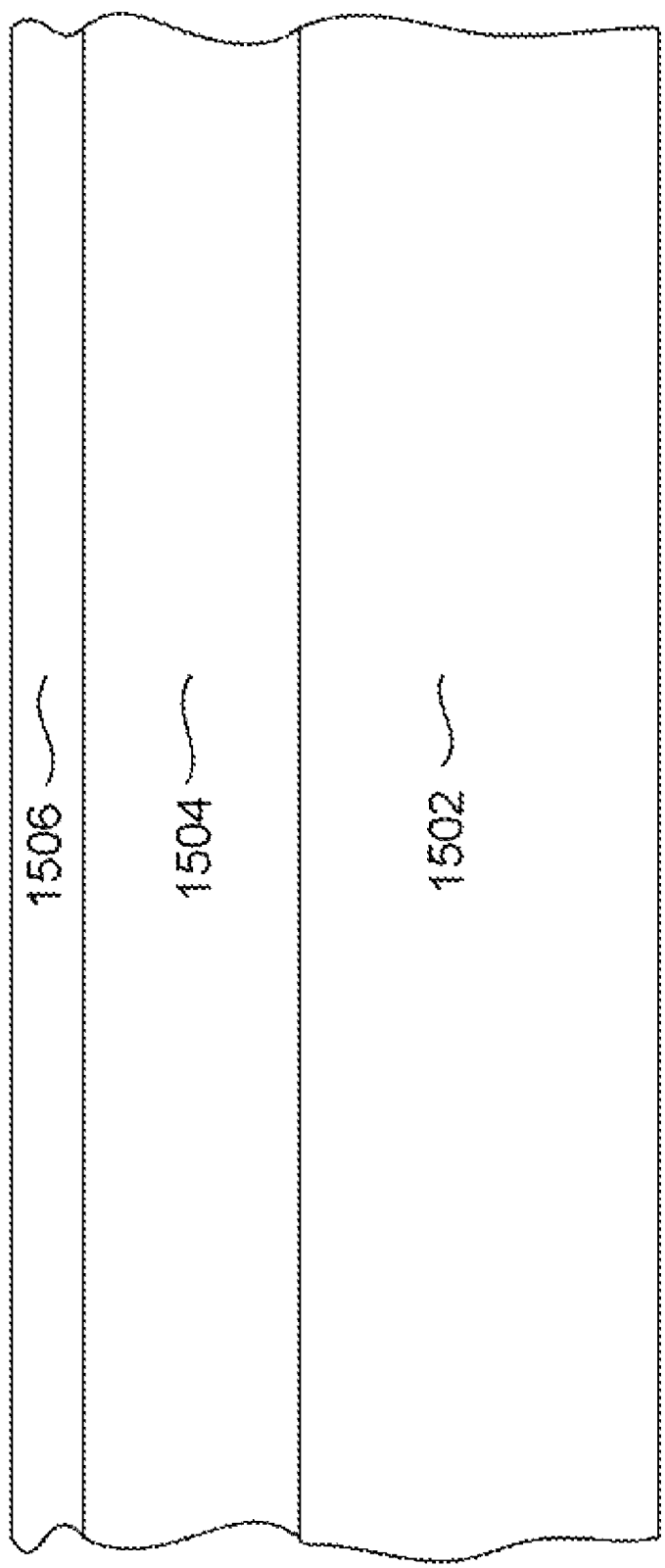
FIG. 15 is a partial, cross-sectional view of a magnetic recording medium according to an embodiment of the invention.

With reference now to FIG. 15, a magnetic recording medium for use in perpendicular magnetic recording includes a substrate 1502, a magnetic soft underlayer 1504 formed on the substrate, and a thin magnetically hard top layer 1506 formed on the underlayer 1504. The substrate may be fabricated from a material such as glass, or alumina titanium carbide, AlTiC, as it is known in the art. The magnetically soft underlayer 1504 can be fabricated from a relatively low coercivity material such as $NiFe_{14}$ or $CoNb_8Zr_5$ (where $NiFe_{14}$ indicates an alloy of Ni and Fe having about 14 atomic percent Fe and $CoNb_8Zr_5$ indicates an alloy of Co, Nb and Zr having about 8 atomic percent Nb and about 5 atomic percent Zr). The higher coercivity top layer 1506 can be fabricated from, for example, a Co—Cr—Pt—B alloy. It may be a single layer, or a multilayer such as that used in antiferromagnetically coupled media.

Figure 16:
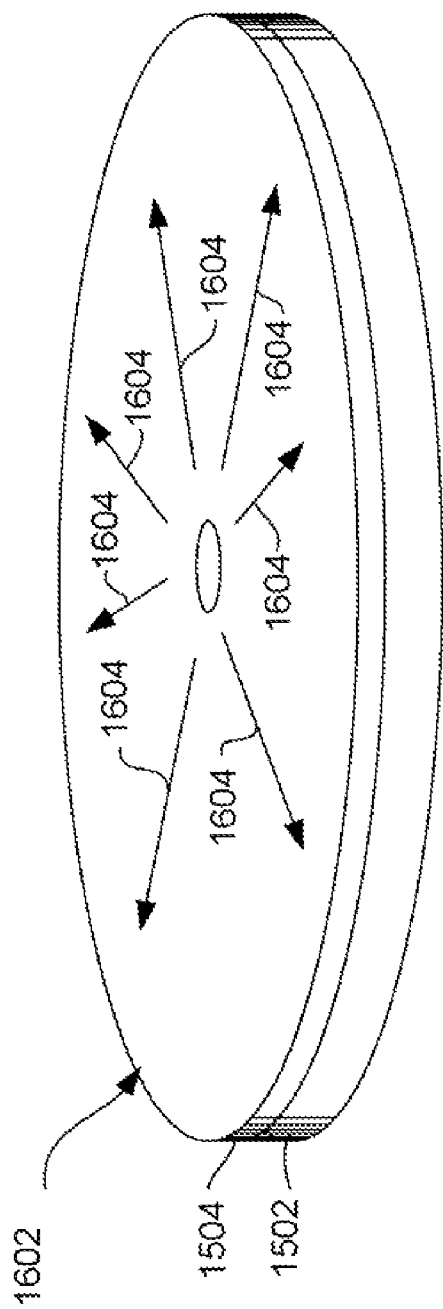
FIG. 16 is a perspective view of a magnetic recording medium, an exemplary disk, according to an embodiment of the invention.

With reference now to FIG. 16, a magnetic disk 1602 comprising the magnetic recording medium is shown with the high coercivity top layer removed for clarity to show the soft underlayer 1504 deposited over the substrate 1502. The disk 1602 has magnetic anisotropy with easy axis of magnetization 1604 in the soft underlayer 1504 (FIG. 15) that is oriented in a radial direction over substantially the entire area of the disk 1062. Such a radially oriented easy axis of magnetization 1604 prevents uncontrolled domain structures from forming in the soft underlayer 1504, which would otherwise cause unwanted noise and performance issues. The magnetic anisotropy with easy axis of magnetization 1604 tends to keep the underlayer 1504 magnetized in a direction substantially perpendicular to the track direction when the disk is not being written to. Furthermore, this magnetic anisotropy is achieved without increasing the magnetic coercivity of the underlayer, so that the underlayer retains a desired level of magnetic permeability.

Figure 17:
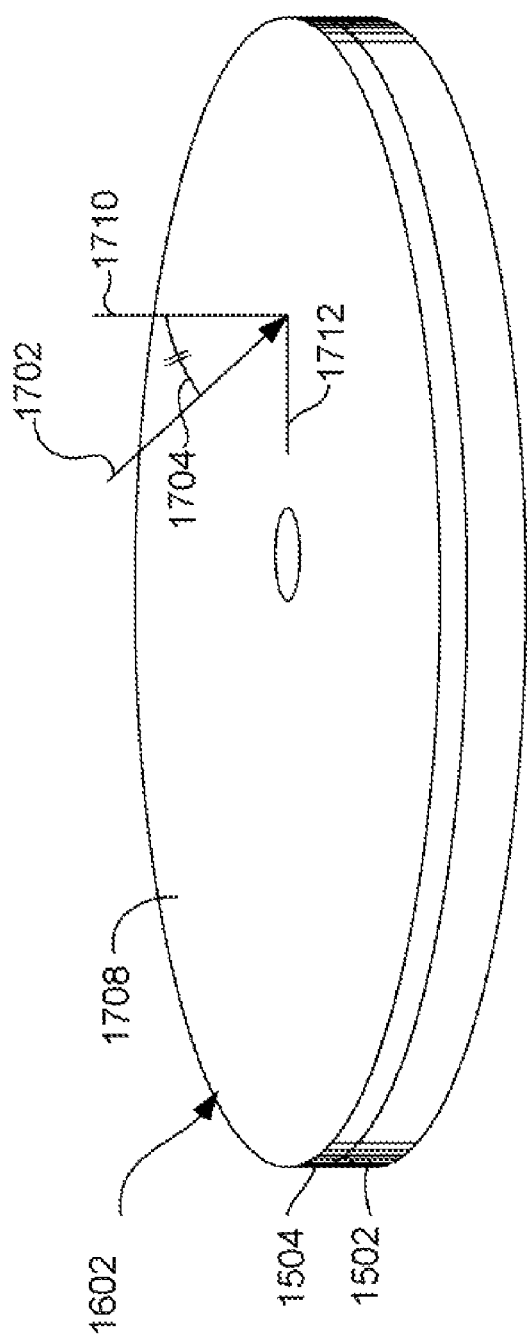
FIGS. 17-20 are perspective views illustrating a method of fabricating a magnetic recording medium, an exemplary disk, according to embodiments of the invention.

With reference to FIG. 17, a method for making a magnetic disk 1602, i.e. magnetic recording medium, with a radially oriented easy axis of magnetization is described. In one possible method of fabricating such a magnetic recording medium, a substrate 1502 is provided; and, a magnetically soft underlayer 1504 is deposited onto the substrate 1502. After deposition of the soft underlayer 1504, a stationary low energy angled ion beam 1702 performs an angled ion milling to mill the surface 1708 of the soft underlayer at an angle 1704 of, for example, 45 degrees, with respect to normal 1710 of the surface 1708 of the underlayer 1504. This ion milling and the resulting texture can be better understood with reference to FIGS. 5A-5D. The initial thickness of the soft underlayer 1504 is chosen to create, after ion milling, a desired final thickness of the soft underlayer 1504 with an appropriate magnetic anisotropy. For a given desired final thickness, larger magnetic anisotropy is obtained with a greater initial thickness and longer milling time.

With continued reference to FIG. 17, in order to form a surface texture that will induce magnetic anisotropy having a radially oriented easy axis of magnetization the ion beam 1702 must be angled such that its projection onto the plane of the surface of the soft underlayer 1504 is either oriented radially, or circumferentially, i.e. normal to, or tangential to circles concentric with the disk, respectively, while rotating and milling the disk under the ion beam. For example, with reference to FIG. 17, the projection 1712 of the ion beam 1702 onto the plane of the surface 1708 is oriented radially with respect to the disk 1602. Depending on the material composition of the soft underlayer 1504 and other factors such as the ion beam energy or the substrate temperature, the easy axis of magnetization associated with the magnetic anisotropy induced by ion milling may be oriented either perpendicular to the ion-milling orientation, or parallel to the ion-milling orientation.

Figure 18:
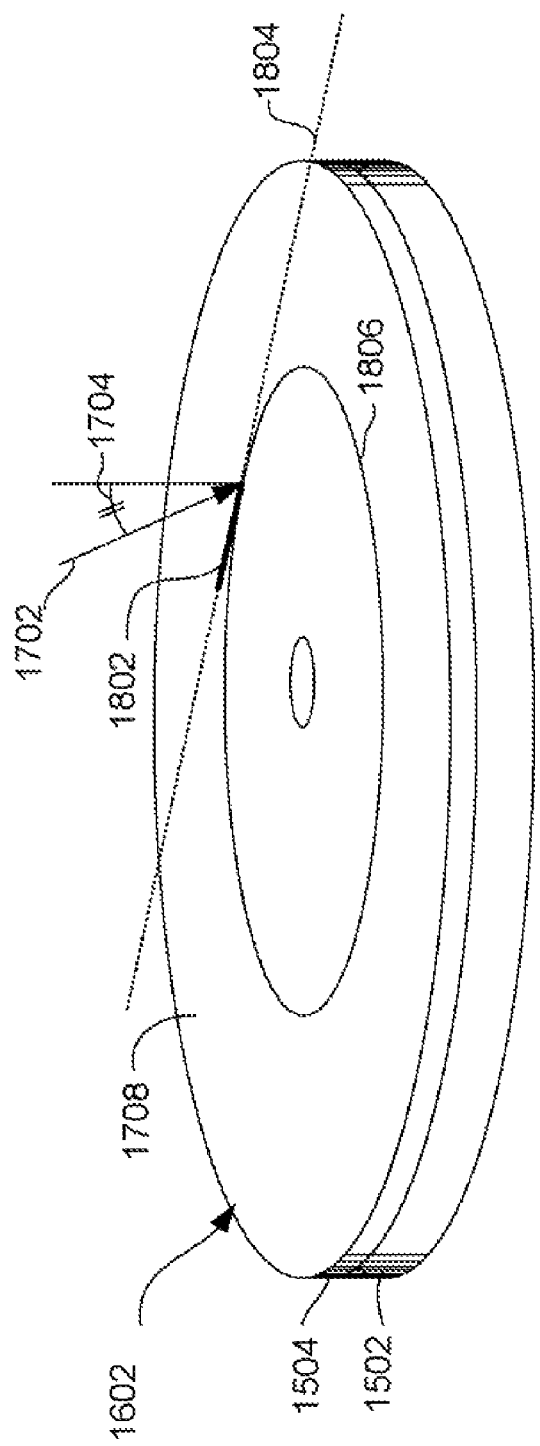

With reference to FIG. 18, the ion beam 1702 performs an angled ion milling such that the projection 1802 of the ion beam 1702 onto the surface 1708 is oriented along a tangent 1804 of a circle 1806 that is concentric with the disk. In other words, the ion milling is performed in a circumferential manner. As mentioned above, the choice of whether to perform the ion milling in a radial direction (as in FIG. 17) or in a circumferential direction (as in FIG. 18) depends on the material used for the underlayer 1504, and may depend upon other parameters as well. The goal, however, is to produce an anisotropic texture on the surface 1708 that will produce a magnetic anisotropy with a radially oriented easy axis of magnetization 1604 (FIG. 16) in the soft underlayer 1504.

Figure 19:
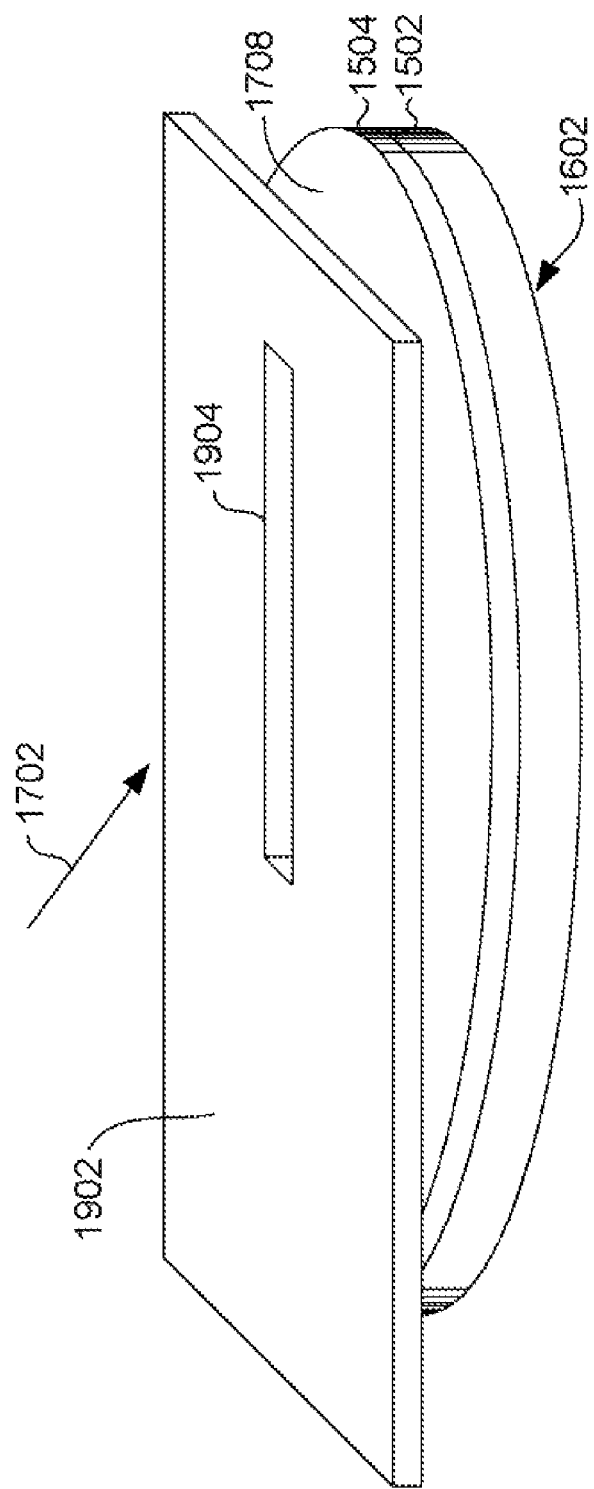

With reference to FIG. 19, in order to ion mill the soft underlayer 1504 radially as described in FIG. 17, a mask 1902 must be used to limit ion milling to a selected portion of the disk while the disk is rotated under the aperture of the mask admitting the ion beam. The mask 1902 can have an aperture 1904 which may be in the form of a slit or elongated opening. This aperture 1904 limits the ion beam 1702 to a limited portion of the disk so that the ion milling can be performed in a radial direction on the surface 1708 of the soft underlayer 1504.

Figure 20:
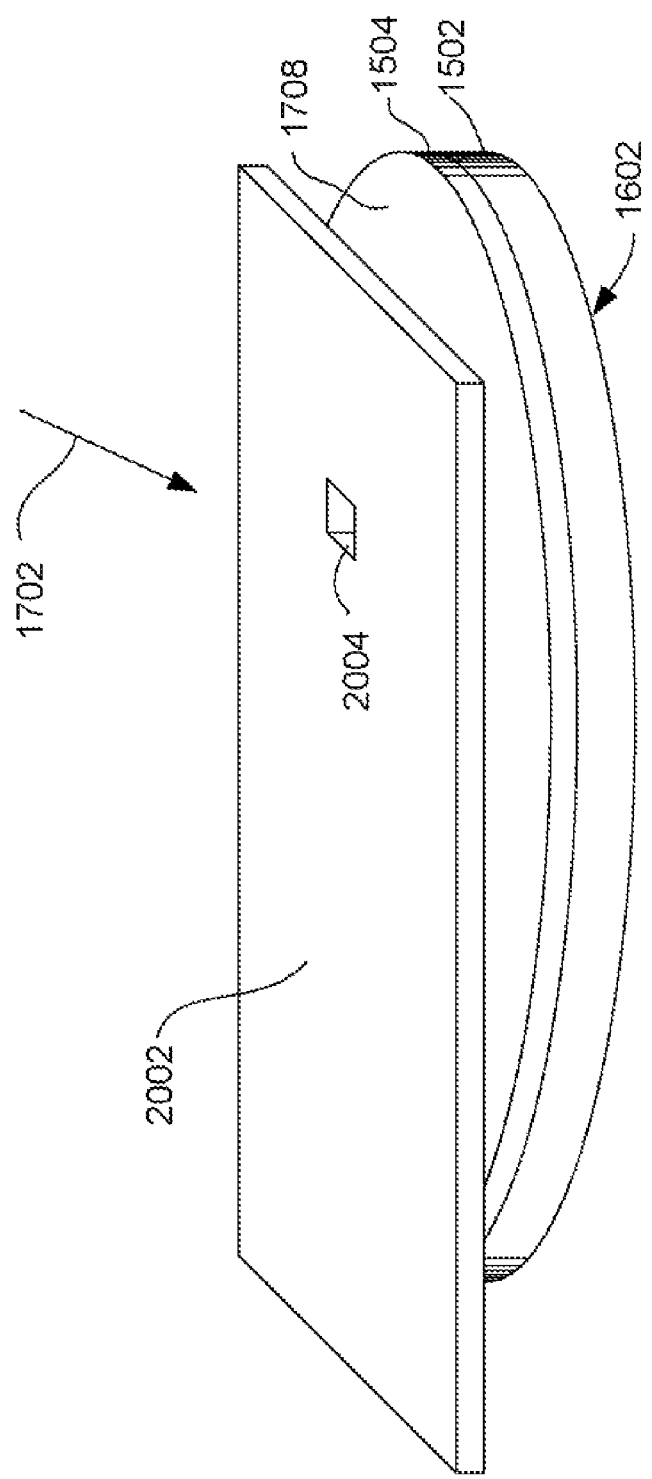

With reference now to FIG. 20, if the ion milling is to be performed in a circumferential direction as described in FIG. 18, a mask 2002 having a smaller aperture 2004 can be used to limit the ion beam 1702 to a relatively small portion of the surface 1708 while the disk 1602 is rotated under the aperture in the mask admitting the ion beam. This aperture 2004 can have various configurations. However, the aperture should be small enough to limit the area over which the ion beam 1702 mills the disk, yet large enough to allow the ion beam 1702 to effectively mill the surface 1708.

It should be pointed out that, while the above-described process has been described in terms of a surface treatment of the surface 1708 of the soft magnetic underlayer 1504 other treatment methods could be used, as well, that fall within the scope of the invention. The treatment could be performed on the underlying layer on which the soft underlayer 1504 is deposited. For example, the surface of the substrate 1502 (FIGS. 17, 18) could be treated by ion milling as described above, and the soft under layer 1704 could be deposited on that treated surface. The ion-milling treatment could be performed on the substrate 1502, itself, or a thin layer of a desired sublayer material could be deposited on the substrate 1502; and, the surface of that thin sublayer material could be treated by ion milling with the ion beam 1702. The soft underlayer 1502 could then be deposited over the sublayer, resulting in a deposited soft magnetic underlayer 1502 having magnetic anisotropy with a radially oriented easy axis of magnetization.

In addition, since, after removing a given amount of material, the effectiveness of the surface treatment described above is inversely proportional to the remaining thickness of the layer being treated, the soft underlayer could be deposited sequentially in steps. For example, a portion of the magnetically soft underlayer 1504 can be deposited, followed by an ion milling with the ion beam 1702, then more of the soft under layer 1504 deposited followed by another ion milling with the ion beam 1702. This process can be repeated as many times as necessary to achieve the desired strength of magnetic anisotropy. In addition, the soft underlayer could be deposited as a laminated structure, with many layers of soft magnetic material, each separated by a thin nonmagnetic layer such as Ni—Cr alloy, Cr, Rh, Ru, Ta, alumina or some other nonmagnetic material. In that case, all, or a portion, of the deposited magnetic layers or its underlying layer, for example, the nonmagnetic lamination layers, can be treated by an ion milling with the ion beam 1702. After the soft underlayer 1504 has been deposited by any of the above described methods, a layer of hard magnetic material, i.e. a material having high coercivity, can be deposited to form the upper, top, magnetic layer 1506 wherein information is recorded and stored on the magnetic recording disk 1602.

Magnetic Shields Having a Magnetic Anisotropy Induced by Direct Ion Milling

Figure 21:
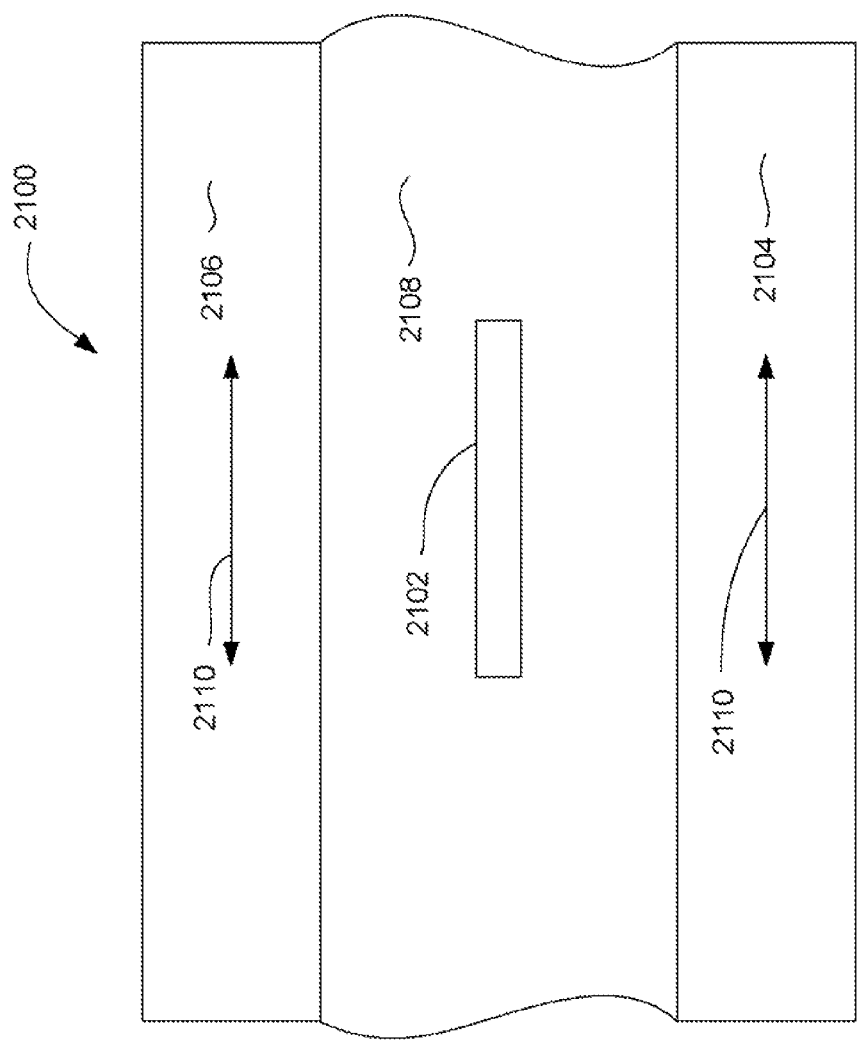
FIG. 21 is a ABS view of a magnetic read head according to an embodiment of the invention.

With reference now to FIG. 21, a magnetic write head 2100 according to an embodiment of the invention as viewed from the direction of a magnetic recording medium (not shown), i.e. as viewed from the air-bearing surface (ABS), includes a magnetoresistive sensor 2102 and first and second magnetic shields 2104, 2106. For illustrative purposes, the sensor 2102 is shown as sandwiched between the first and second shields 2104, 2106, and, as embedded in a dielectric layer 2108, although, as is known in the art, leads are in communication with the sensor 2102.

One or both, preferably both, of the magnetic shields 2104, 2106 have a magnetic anisotropy each with its own easy axes of magnetization 2110 that are oriented substantially perpendicular to the track direction and substantially parallel with the medium facing surface, i.e. air-bearing surface (ABS), of the read head 2100 as shown in FIG. 21. This magnetic anisotropy is created by one or more surface texture treatments that will be described in greater detail herein below.

Figure 22:
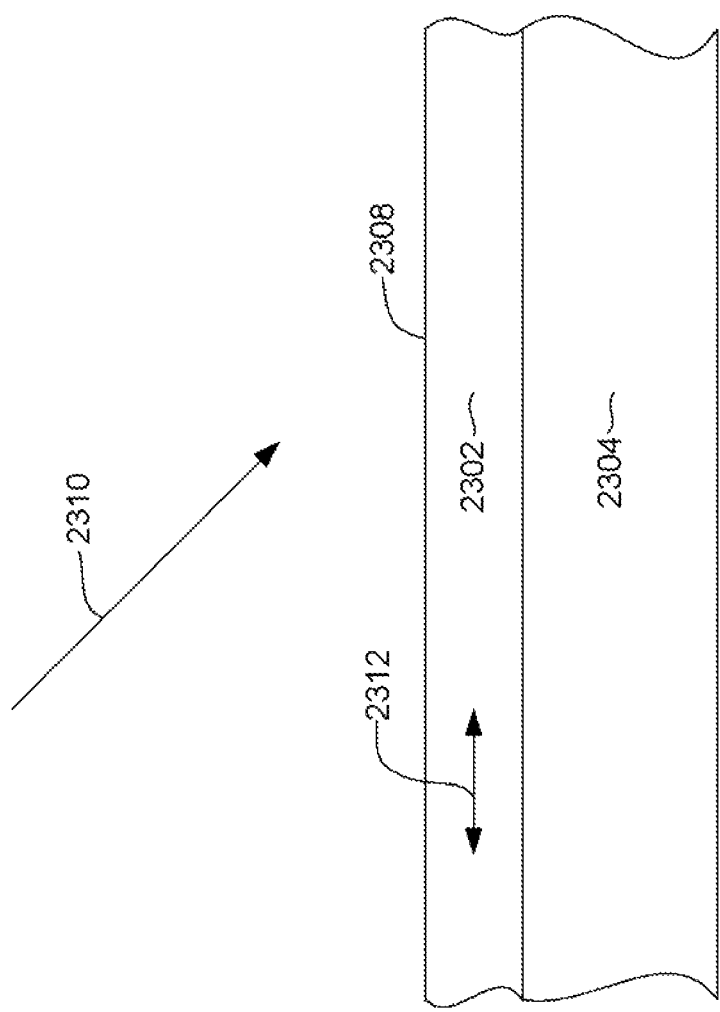
FIGS. 22-26 are views illustrating methods of fabricating magnetic shields according to various embodiments of the invention.
Figure 23:
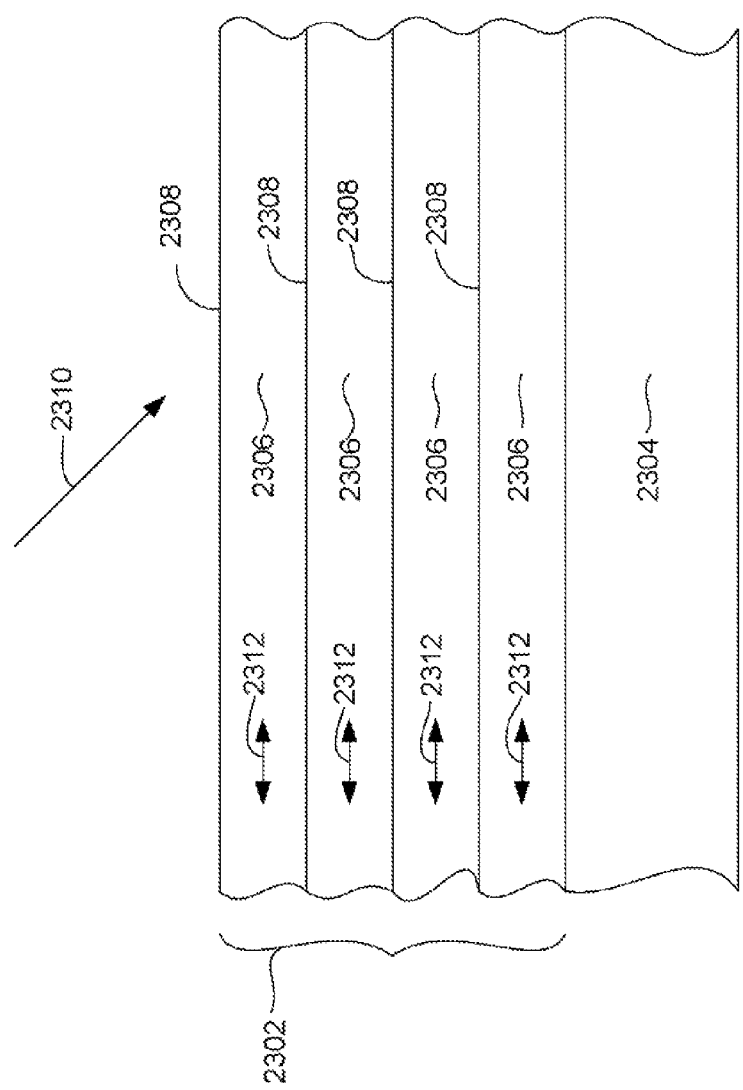

With reference know to FIGS. 22 and 23, in an embodiment of the invention, a magnetic shield structure 2302 is fabricated upon a substrate 2304. The substrate 2304 can be a nonmagnetic, electrically insulating gap or fill layer such as alumina ($Al_2O_3$), or some other electrically insulating material. As shown in FIG. 23, the shield structure 2302 may include multiple layers of magnetic material 2306 each of which, or a selected portion of which, has a surface 2308 treated with an anisotropic surface texture. The magnetic layers 2306 can be composed of, for example, a Ni—Fe alloy, or some other magnetic material, preferably having high magnetic permeability, and low coercivity. The shield structure 2302 can be fabricated by depositing a magnetic layer 2306, and performing a static, angled ion milling with an ion beam 230 as shown in FIG. 22. Then, another layer of magnetic material 2306 is deposited; and, another ion milling with ion beam 2310 is performed on the surface 2308 of that layer. This process is repeated until a complete shield having a desired magnetic anisotropy with easy axis of magnetization 2312 has been fabricated.

The treated surfaces 2308, or interfaces between the magnetic layers 2306, are provided with the anisotropic surface texture by the angled ion milling with the ion beam 2310. This ion milling procedure and the resulting anisotropic surface texture, or roughness, are described in greater detail with reference to FIGS. 5A through 5D. The direction at which the ion milling with the ion beam 2310 is performed and the orientation of the resulting anisotropic surface texture, or roughness, depend upon the composition of the material used to fabricate the magnetic layers 2306, as well as possibly other factors such as the ion beam energy or substrate temperature. However, the direction of the ion milling with the ion beam 2310 and resulting surface texture are chosen so as to induce a magnetic anisotropy with easy axis of magnetization 2312 in the magnetic layers 2306 in a direction substantially parallel with the air-bearing surface (ABS) and substantially perpendicular to the write track direction.

Figure 24:
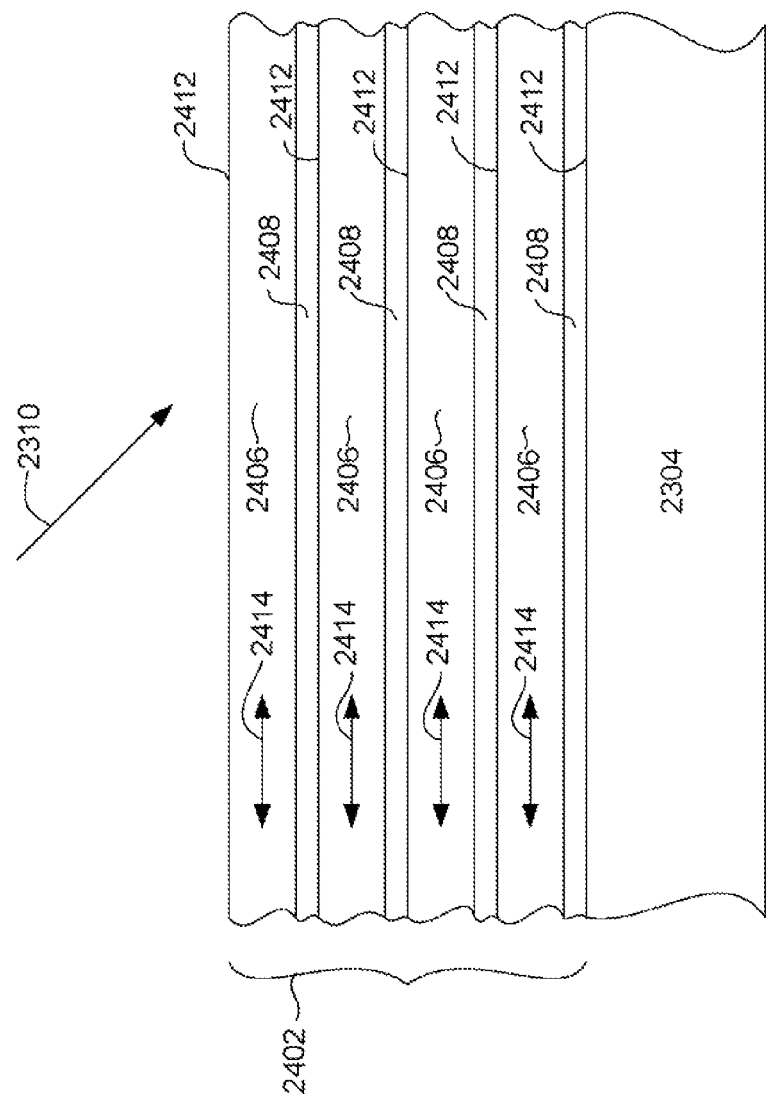

With reference now to FIG. 24, in another possible embodiment of the invention, a magnetic shield structure 2402 fabricated upon a substrate 2304 includes multiple layers 2406 of magnetic material separated by thin layers of nonmagnetic material 2408. In this laminated shield structure 2402, the magnetic layers 2406 may be composed of a Ni—Fe alloy, or some other magnetic material. The nonmagnetic lamination layers 2408 may be composed of, for example, a Ni—Cr alloy, Cr, Rh, Ru, alumina, Ta, or some other nonmagnetic material, and may be electrically conductive, or electrically insulating as desired. The magnetic layers 2406 each have a surface 2412 treated with an anisotropic texture, or roughness, that induces a magnetic anisotropy with easy axis of magnetization 2414 in the magnetic layers 2406. The anisotropically textured surfaces, or interfaces between the magnetic layers 2406 and nonmagnetic layers 2408, can be treated by an ion milling with an ion beam 2310 oriented in such a manner as to create the desired magnetic anisotropy with easy axis of magnetization 2414 in the magnetic layers 2406. As mentioned above, the ion milling is described in greater detail with reference to FIGS. 5A-5D. Although the ion milling is shown as being performed on the top magnetic layer 2406, it should be understood that the ion milling can be performed on each, or a selected number, of the magnetic layers 2406 prior to depositing the subsequent nonmagnetic layer 2408.

The laminated structure of the shield 2402 advantageously prevents the formation of domains in the shield 2402, and also increases the effective anisotropy with easy axis of magnetization 2414 by providing an antiparallel coupling between the magnetic layers 2406. For a given amount of material removed, the effectiveness of the milling-induced, surface treatment of a magnetic layer in creating a magnetic anisotropy in the magnetic layer is inversely proportional to the remaining thickness of the magnetic layer being treated. Therefore, by creating multiple magnetic layers and multiple surface treatments, the amount of magnetic anisotropy with easy axis of magnetization 2414 for the magnetic shield is increased dramatically. This benefit applies to the structure described with reference to FIG. 23, as well as the embodiment described with reference to FIG. 24.

While the embodiment described with reference to FIG. 24 has been described as having the surface of each of the magnetic layers 2408 treated by ion milling, it should be pointed out that in addition to, or in lieu of, treating the surface 2412 of the magnetic layers, the surface of the nonmagnetic layer 2408 can be treated as well. In that case, the treatment of the surface of the nonmagnetic layer creates an anisotropic texture in the surface of the nonmagnetic layer 2408 that induces a magnetic anisotropy in the magnetic layer 2406 deposited thereover.

Figure 25:
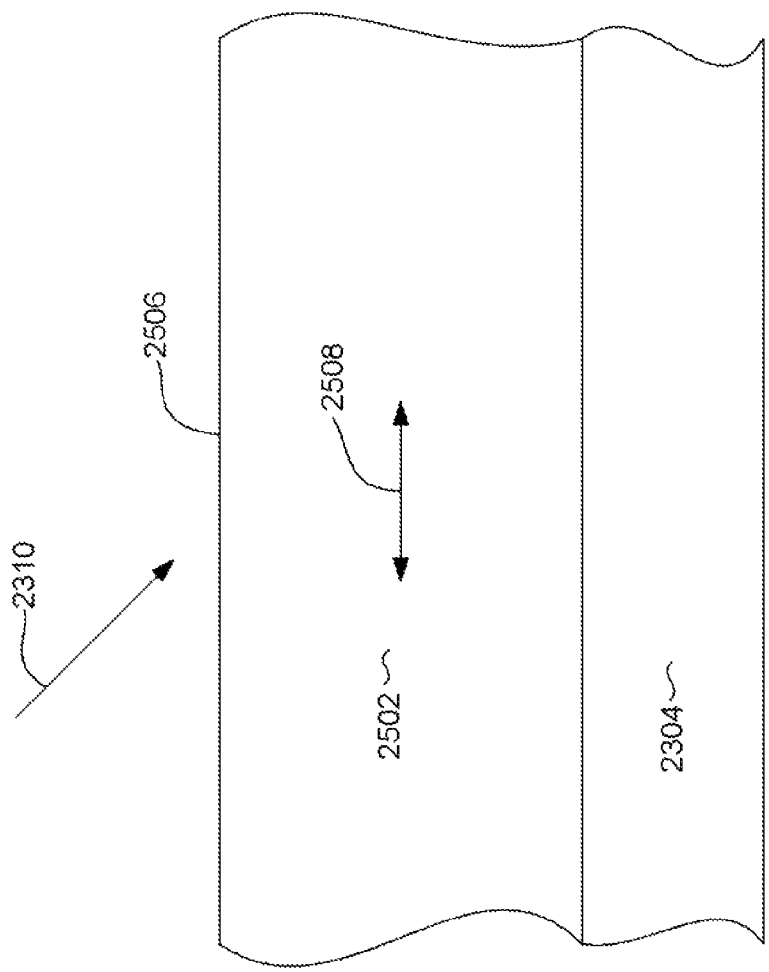

With reference now to FIG. 25, another embodiment of the invention includes a single layer shield 2502 formed over the substrate 2304. The magnetic shield 2502 can be fabricated from a magnetic material such as a Ni—Fe alloy, or some other magnetic material, and has a surface 2506 that has been treated by an angled ion milling to provide it with an anisotropic texture. As with the previously described embodiments, the ion milling and resulting surface texture, or roughness, are chosen to induce a magnetic anisotropy with easy axis of magnetization 2508 that is oriented substantially perpendicular to the track direction and substantially parallel with the ABS. Also, as with the previously described embodiments, the ion milling and resulting surface texture are described in greater detail in FIGS. 5A through 5D. Also, in addition to, or in lieu of, treating the surface 2506 of the magnetic shield 2502 with the ion milling, a similar ion milling can be performed on the underlying substrate to create an anisotropic surface texture, or roughness, in the substrate 2304 that will induce a desired magnetic anisotropy in the later deposited shield 2502.

Figure 26:
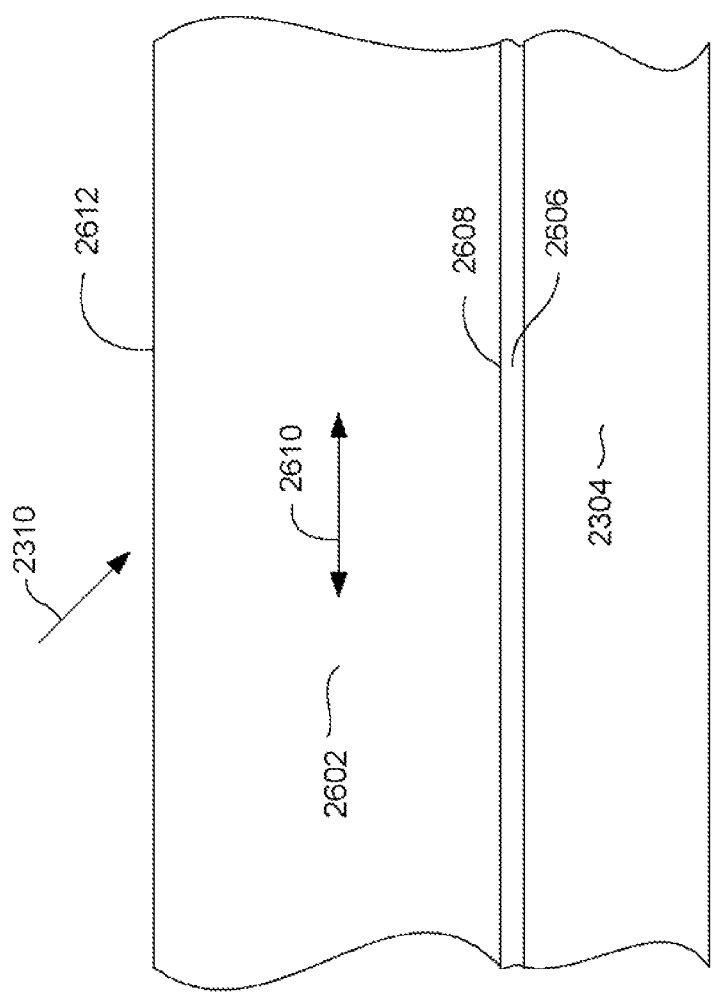

With reference now to FIG. 26, a magnetic shield 2602 can be fabricated upon an underlayer 2606 over a substrate 2304. Again the shield 2602 is fabricated from a magnetic material such as a Ni—Fe alloy, and the substrate 2304 can be alumina, or some other substrate material. The underlayer 2606 has a surface 2608, interface between the underlayer 2606 and shield 2602 that has been treated by an ion beam 2310 to give it an anisotropic surface texture. The underlayer 2606 is fabricated from a material such as a Ni—Fe—Cr alloy, a Ni—Cr alloy, Rh, Ta, Ru that is chosen to induce a strong magnetic anisotropy with easy axis of magnetization 2610 in the magnetic shield 2602. The surface 2608 can be treated by an ion milling as described with reference to FIGS. 5A through 5D. In addition to treating the surface 2608 of the underlayer 2606, the surface 2612 of the shield 2602 can be similarly treated by an ion milling to create an anisotropic surface texture, or roughness, that will increase the magnetic anisotropy with easy axis of magnetization 2610 in the shield 2602.

Uncontrolled domain structures in magnetic shields cause unwanted noise and performance issues in shielded magnetic sensors. The magnetic anisotropy provided by the present invention inhibits the formation of these undesirable domain structures in the shields, thereby increasing the performance of the shields. The present invention provides a desired magnetic anisotropy without increasing the coercivity of the shield. It has been found that providing a magnetic anisotropy in a magnetic shield, especially in the initial layers of the shield, decreases noise in the sensor. Also, creating a magnetic anisotropy in the shield prevents the shield from becoming saturated in the pole direction, i.e. perpendicular to the medium, thereby preventing the shield from erasing data from the magnetic recording medium.

Figure 27:
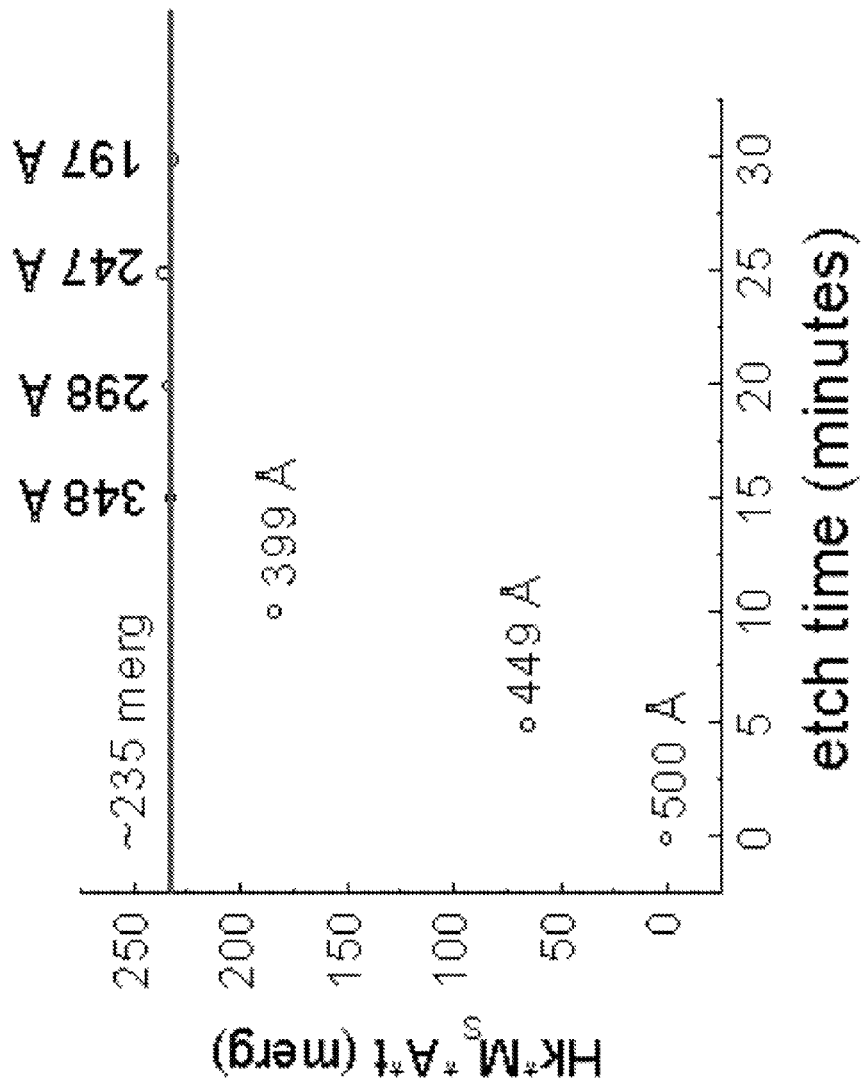
FIG. 27 is a graphical representation illustrating a relationship between milling time and magnetic anisotropy energy.
Figure 28:
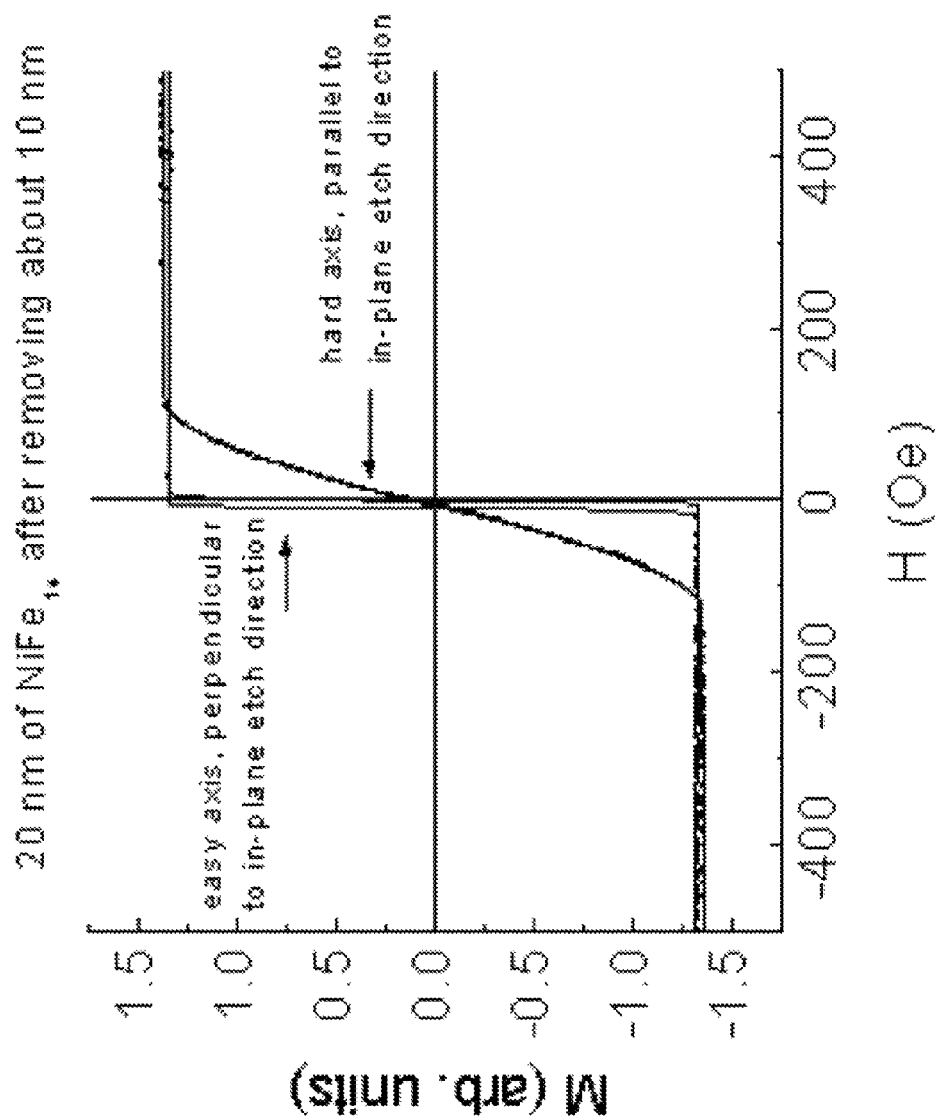
FIG. 28 is a graphical representation demonstrating the effect of magnetic anisotropy on M-H hysteresis loops of an ion-milled, magnetic thin film taken parallel and perpendicular to the direction of ion milling as provided by an embodiment of the present invention.
Figure 29:
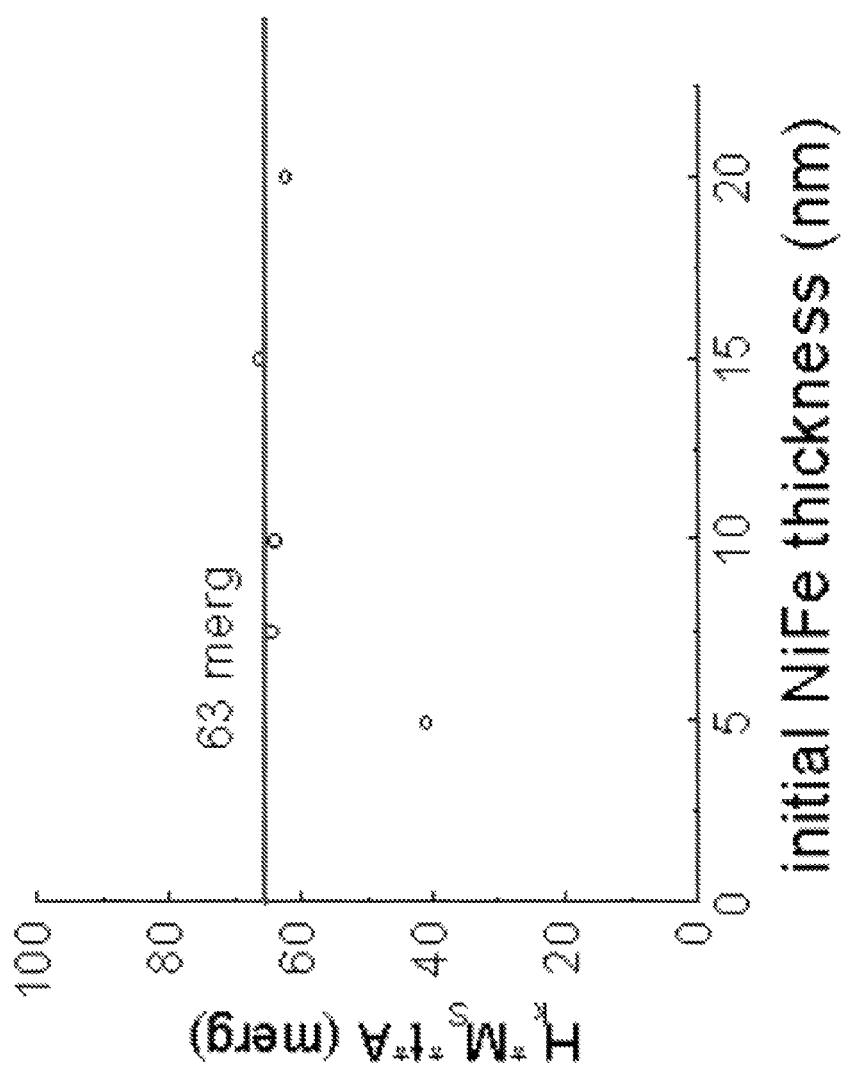
FIG. 29 is a graphical illustration of a relationship between thickness and magnetic anisotropy energy.

With reference now to FIGS. 27-29, the effect of ion milling on magnetic anisotropy can be seen more clearly. FIGS. 27-29 illustrate the anisotropy energy created by milling an initially 500 Angstrom thick $NiFe_{14}$ film (where $NiFe_{14}$ indicates an alloy of Ni and Fe having about 14 atomic percent Fe). As can be seen with reference to FIG. 27 the effect of ion milling saturates after about 15 minutes, or after about 150

Angstroms have been removed. This further shows that after removing sufficient magnetic material, in the case of a Ni—Fe alloy about 150 Å, the milling-induced anisotropy behaves as a surface anisotropy, because the anisotropy field, $H_K$, scales with the inverse thickness, t, of the remaining magnetic layer material. Note that the ordinate in FIG. 27, $H_K M_S A t$, is given in units of energy, merg ($10^{-3}$ erg), where $H_K$ is the anisotropy field; $M_S$, the saturation magnetization; A, the area; and t, the thickness of the $NiFe_{14}$ thin film. With reference to FIG. 29, the anisotropy energy for a given milling time, here 5 minutes, is constant regardless of the initial magnetic film thickness, except if the final film thickness becomes too thin, which is the case here, if the initial $NiFe_{14}$ film thickness is 5 nm.

Use of Anisotropic Milling in a Magnetic Random Access Memory (MRAM) Array

The desired characteristics of a memory system for computer main memory are high speed, low power, nonvolatility, and low cost. Low cost is achieved by using a simple fabrication process, and a small cell size. Dynamic random access memory (DRAM) cells are fast and expend little power, but have to be refreshed many times each second and require complex structures to incorporate a capacitor in each cell. Flash type EEPROM cells are nonvolatile, have low sensing power, and can be fabricated as a single device, but take microseconds to write and milliseconds to erase, which makes them too slow for many applications, especially for use in computer main memory. Conventional semiconductor memory cells such as DRAM, ROM, and EEPROM have current flow in the plane of the cell, i.e., "horizontal", and therefore occupy a total surface area that is the sum of the essential memory cell area plus the area for the electrical contact regions, and therefore do not achieve their theoretical minimum cell area, or cell size.

Unlike DRAM, a magnetic memory cell that stores information as an orientation of magnetization of a ferromagnetic region can hold stored information for long periods of time, and is thus nonvolatile. A magnetic memory cell that uses the magnetic state of the ferromagnetic region to alter the electrical resistance of the memory cell can be described as a magnetoresistive (MR) memory cell. An array of magnetic memory cells can be called magnetic RAM or MRAM.

Although many types of MR cells could been used in an MRAM array, magnetic tunnel junction (MTJ) sensors, also called tunnel valves (TVs), are preferable; although other magnetic memory cells such as current-perpendicular-to-plane, giant magnetoresistive (CPP-GMR) cells can be used as well.

Figure 30:
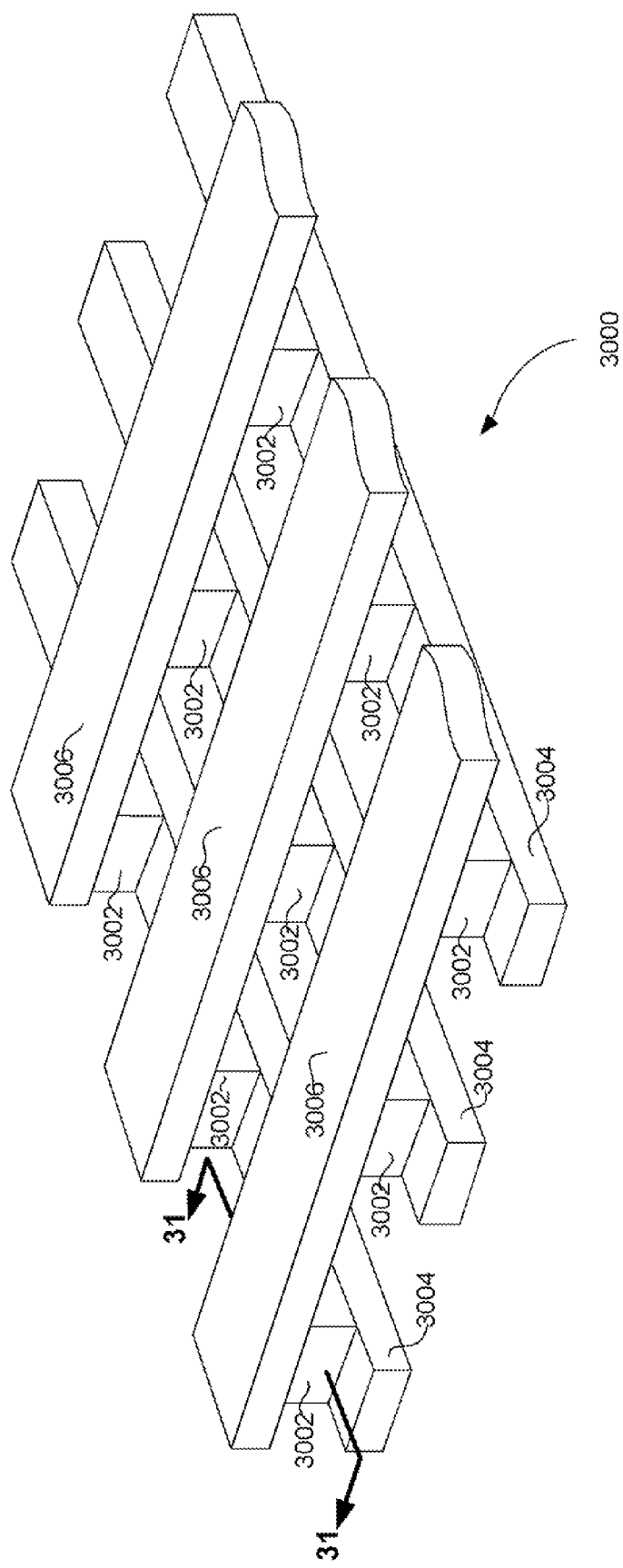
FIG. 30 is a perspective schematic view of a Magnetic Random Access Memory (MRAM) array.

With reference now to FIG. 30, a magnetic random access memory array 3000 includes a plurality of memory cells 3002 positioned at intersections of an exemplary rectangular grid of electrically conductive word lines 3004 and bit lines 3006. The word lines 3004 are arrayed as parallel lines in a first plane, and the bit lines 3006 are arrayed in parallel lines, perpendicular to the word lines in a second plane. Each magnetic memory cell 3002 connects one word line 3004 with a bit line 3006, bridging the space between the planes of the word lines and bit lines at the intersection of the word and bit line 3004, 3006. Although three word lines and three bit lines are shown in FIG. 30, this is for purposes of illustration only and the actual number of word lines 3004, bit lines 3006, and magnetic memory cells 3002 would be much larger.

During a sensing or reading operation of the array, current flows in a vertical direction through the cell 3002. The vertical current path through the cell 3002 permits the magnetic memory cell to occupy a very small surface area. The array may be formed on a substrate (not shown), which contains other circuitry. The magnetic memory cell is a magnetoresistive memory cell that has high and low resistance states, i.e. on and off, that correlate to the magnetic state of layers within the sensor. The memory state of the sensor 3002 can be switched by conducting a current through the word and bit lines 3004, 3006 associated with a particular memory cell 3002 to thereby cause magnetic fields to emanate from the particular word and bit lines 3004, 3006. This switching process will be discussed in more detail below, after further discussion of the structure of the cell 3002.

Figure 31:
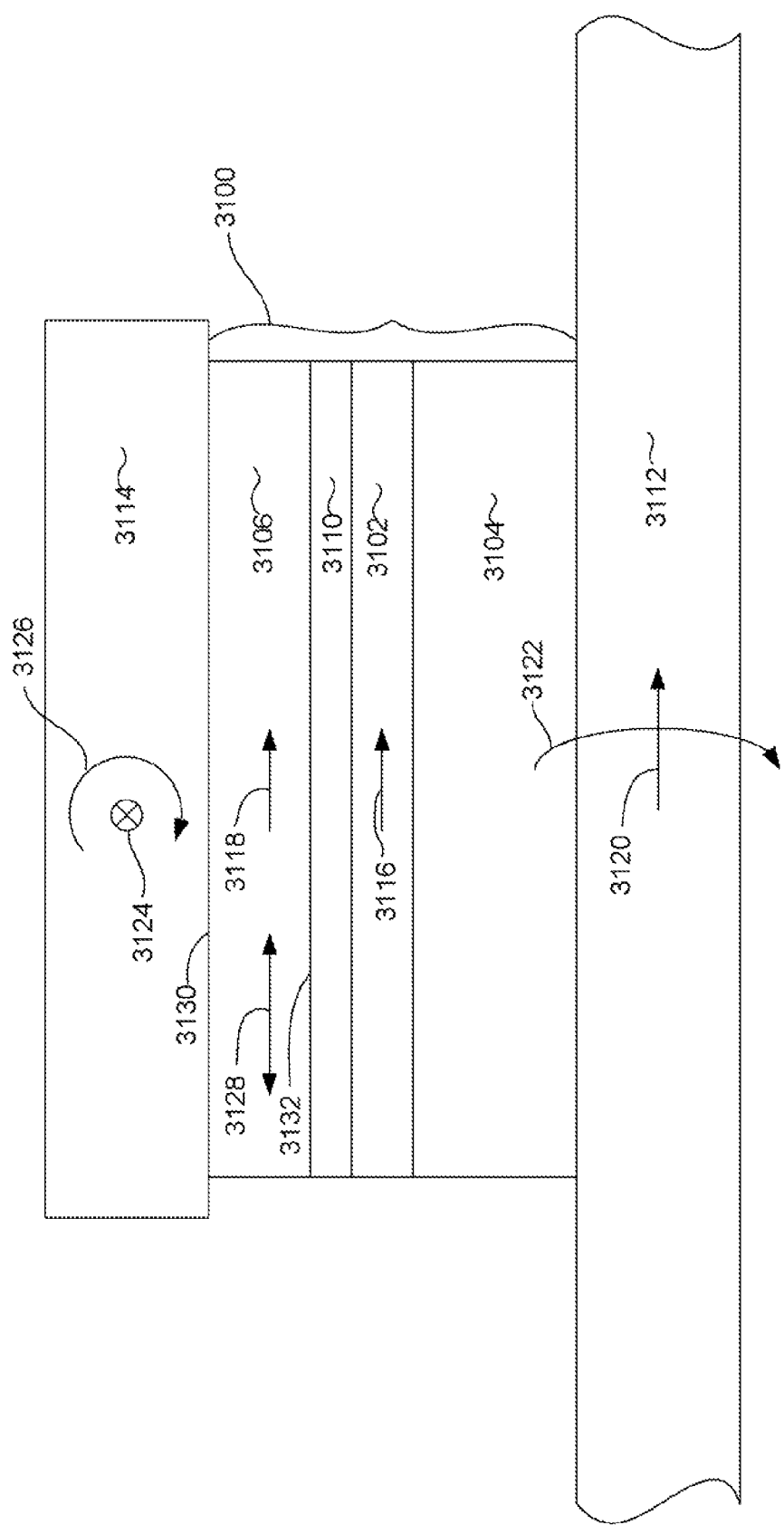
FIG. 31 is a side, cross-sectional view of a magnetic memory cell of a Magnetic Random Access Memory (MRAM) array.

With reference now to FIG. 31, a magnetic memory cell 3100 according to an embodiment of the invention is sandwiched between an word line 3112 and a bit line 3114. The bit line 3114 is shown in cross section in FIG. 31 and would extend into and out of the plane of the figure.

The memory cell includes first and second magnetic layers 3102 and 3106. A nonmagnetic layer 3110 is sandwiched between the first and second magnetic layers 3102, 3106, and may be nonmagnetic, electrically insulating barrier layer, if the cell 3100 is a tunnel valve, or a nonmagnetic, electrically conductive spacer layer, if the cell 3100 is a CPP-GMR sensor.

The first magnetic layer 3102 has a magnetization 3116 that is pinned in a desired direction. This first magnetic layer 3102 can therefore, be referred to as a pinned layer. The pinned layer can be a laminated structure such as an antiparallel-coupled, pinned-layer structure, such as FM1/AFC/FM2, where FM1 and FM2 are two ferromagnetic layers such as a Co—Fe alloy, or a Ni—Fe alloy, and AFC is an antiparallel-coupling layer such as Ru, Ir, Cr, or Rh. The second magnetic layer 3106 has a magnetization 3118 that can move between two stable states either parallel (as shown) or anti-parallel with the magnetization 3116 of the pinned layer 3102. This second magnetic layer 3106 can, therefore, be referred to as a free layer. Pinning of the magnetization 3116 of the pinned layer 3102 can be maintained by an exchange field caused by exchange coupling of the pinned layer 3102 with a layer of antiferromagnetic (AFM) material layer 3104.

The AFM layer 3104 can be fabricated from an Ir—Mn alloy, an Ir—Mn—Cr alloy, or a Pt—Mn alloy, the preferred compositions of each being about 70-80 atomic percent Mn and the balance Ir, about 75 atomic percent Mn, 5 atomic percent Cr and the balance Ir, and 50 atomic percent Mn and the balance Pt, respectively, or some other antiferromagnetic material. The first and second magnetic layers 3102, 3106 can be fabricated from a magnetic material such as a Co—Fe, Ni—Fe alloy, or some combination of these, or other magnetic materials. The nonmagnetic layer 3110 can be aluminum oxide ($AlO_x$), magnesium oxide ($MgO_x$), titanium oxide ($TiO_x$), (where the subscript x, indicates that the oxide need not be stoichiometric, but does not preclude a stoichiometric oxide such as alumina ($Al_2O_3$)), or some other electrically insulating material, if the cell 3100 is a tunnel valve, or can be an electrically conductive material such as Cu, if the cell 3100 is a CPP-GMR sensor. The word and bit lines 3112, 3114 can be fabricated from Cu, Au, or some other electrically conductive, nonmagnetic material.

Alternatively to a pinned layer exchanged coupled to an AFM layer, the first magnetic layer 3102 may be a magnetic layer exhibiting much larger coercivity than the second magnetic layer 3106, for example, $Co_{1-x}Pt_x$ (8<x<30 at %). In this case, layer 3104 may be an underlayer such as Cr, a Cr—V alloy, a Cr—Ti alloy, or a Cr—Mo alloy.

With continued reference to FIG. 31, the cell 3100 functions based on the spin dependent tunneling, in the case of a tunnel valve, or spin dependent scattering, in the case of a GMR sensor, of elections through the nonmagnetic barrier/ spacer layer 3110. When the magnetizations 3116, 3118 of the pinned layer 3102 and free layer 3106 are parallel to one another, i.e. in the same direction, electrical current can flow relatively freely through the cell 3100 from between the word and bit lines 3112, 3114. In this state, the cell 3100 is considered to be in the "on" state. When the magnetizations 3116, 3118 are antiparallel to one another, i.e. in opposite directions, the flow of current through the cell 3100 is restricted and the cell 3100 is considered to be in the "off" state.

In order to flip the magnetization of the free layer 3106 from one orientation to another, current can be caused to flow through the word and bit lines 3112, 3114. For example, if the magnetization 3118 of the free layer 3106 is initially oriented as shown in FIG. 31, a current 3120 through the word line 3112 creates a magnetic field 3122 about the word line 3112. This magnetic field causes the magnetization 3118 of the free layer 3106 to rotate from its initial orientation. An electrical current 3124 (shown as directed into the plane of the figure in FIG. 31) creates a magnetic field 3126 about the bit line 3114. This magnetic field 3114 completes the switching of the magnetization 3118 of the free layer, causing the magnetization 3118 to switch to the left, rather than to the right, in this illustrative case.

As can be appreciated, some mechanism is needed to cause the magnetization 3118 of the free layer 3106 to be stable in either the "off, " or "on" state, i.e. to the right, or to the left, while still allowing the magnetization 3118 to be free to rotate from one state to the other. To meet this need, the free layer has a magnetic anisotropy with easy axis of magnetization 3128. This magnetic anisotropy is generated, at least in large part, by an anisotropic surface texture, or roughness.

The free layer 3106 has a surface 3130, which can be treated by an angled, direct ion milling that produces an anisotropic surface texture, or roughness (not shown in FIG. 31). This anisotropic surface texture induces a uniaxial magnetic anisotropy with easy axis of magnetization 3128 in the free layer 3106 in a desired direction parallel with the magnetization 3116 of the pinned layer 3116. Direct angled ion milling and the resulting anisotropic surface texture, or roughness, is described in much greater detail with reference to FIGS. 5A-5D, wherein the layer 502 corresponds to the free layer 3106 in FIG. 31.

Alternatively, rather than treating the surface of the free layer 3106 with the angled direct ion milling described above, the surface of the underlying barrier/spacer layer 3110 can be treated with the angled ion milling described in FIGS. 5A-5D. In this case, the layer 502 described in FIGS. 5A-5D corresponds to the barrier spacer layer 3110 in FIG. 31. The resulting anisotropic texture, or roughness, of the surface 3132 of the barrier/spacer layer 3110 results in a desired magnetic anisotropy in the later deposited free layer 3106.

In addition to the magnetic anisotropy with easy axis of magnetization 3128 of the free layer 3106, the pinned layer 3102 can be treated in a similar manner to give it a magnetic anisotropy with an easy axis of magnetization that is also parallel with the magnetic anisotropy with easy axis of magnetization 3128 of the free layer 3106. This can be accomplished by treating the surface of the pinned layer 3102 as described in FIGS. 5A-5D to create an anisotropic surface texture, or by treating the surface of the AFM layer 3104 as described in FIGS. 5A-5D to create an anisotropic surface texture on the surface of the AFM layer 3104. If the pinned layer is laminated such as an FM1/AFC/FM2 the top surface of each FM1, AFC, FM2 can be treated as described in FIGS. 5A-5D to create an anisotropic surface texture.

Alternatively, if the first magnetic layer 3102 is a hard magnetic layer such as $Co_{1-x}Pt_x$ (8<x<30 at %), the surface of the underlayer 3104 can be treated as described in FIGS. 5A-5D to create an anisotropic texture, or roughness, on the surface of the underlayer 3104.

Magnetoresistive Sensor Having a Magnetically Stable Free Layer with a Positive Magnetostriction Since their original introduction, the growth in storage capacities of magnetic data storage systems has grown steadily by a factor of tens of thousands, and the size, in physically scaled dimensions, of sensors used therein has shrunk commensurately. As storage capacities have grown and magnetoresistive sensors have shrunk in size, achieving an adequate read-back signal relative to the system and disk noise has become increasingly challenging. Free layers in such sensors have been fabricated from Ni—Fe alloys such as an alloy containing about 80 atomic percent Ni and about 20 atomic percent Fe or, more recently, have been fabricated as bi-layers having a layer of Ni—Fe alloy and a layer of Co—Fe alloy, i.e. 90 atomic percent Co and 10 atomic percent Fe. In order to further increase the performance of such sensors, it is necessary to fabricate a free layer of materials other than those recited above.

For proper operation of a magnetoresistive sensor, the free layer first must have a soft magnetic character. Secondly, it also must have its rest magnetization angle at, or nearly parallel to, the air-bearing surface (ABS) of the sensor. Thirdly, the free layer must also be magnetically stable, i.e. in an essentially single domain state of magnetization, in order to produce a smooth magnetoresistive response to applied signal fields, for example, from the magnetic recording disk, and to return faithfully to its rest angle when excitation from the field subsides. The second and third requirements are partially determined by the free-layer's magnetic anisotropy.

This magnetic anisotropy can have several sources: magnetocrystalline anisotropy, induced anisotropy (for example, by annealing or deposition in a magnetic field), shape anisotropy, exchange anisotropy, and stress-induced anisotropy. The overall value of the magnetic anisotropy is given by the contributions to the total magnetic anisotropy energy from these various sources. These various sources of anisotropy energy produce associated anisotropy energy surfaces wherein the energy varies as a function of the direction cosines of the internal magnetization vector for the magnetization state of the free layer, or more generally, any magnetic layer, and these energy surfaces generally have minima in disparate directions, corresponding to their respective easy axes of magnetization, and combine in a complex way to determine the overall, net magnetic anisotropy with a resultant easy axis of magnetization for the free-layer.

Throughout the rich history of magnetoresistive sensors, it has always been taught that the magnetostriction, $\lambda$, of the free-layer/sensing layer needs to be zero or held to some negative value. Any past attempts to fabricate a sensor with a free layer having a positive magnetostriction, $\lambda$, were met with failure due to the high incidence of sensor instability and noise. This has been due to the fact that the anisotropy due to stress is the product of the stress, such as that induced during lapping, and magnetostriction, $\lambda$. The stress derives from internal forces within the films of the sensor, and from forces applied during the mechanical finishing operations such as lapping. Additionally, stress-induced anisotropy can readily be large enough to swamp out the other sources of competing anisotropy energy in the free layer. The practical experience has been that the final stress state of the sensor combined with a negative magnetostriction, $\lambda$, in the free layer results in a free-layer, stress-induced magnetic anisotropy with an easy axis of magnetization substantially parallel to the air-bearing surface. If magnetostriction, $\lambda$, were positive, the stress-induced magnetic anisotropy would swing the easy axis of magnetization into an orientation substantially orthogonal to the ABS, so that the resulting magnetic anisotropy would render the sensor unstable. Therefore, the prior art has strongly taught away from fabricating a magnetoresistive sensor having a free layer with a positive magnetostriction.

In order to meet future performance demands, it will become necessary to find a way to use magnetic alloys and compositions in a free layer that have heretofore not been considered for the above described reasons in order to better optimize signal levels from the sensor. These material choices require one to consider magnetic film alloys that have a positive magnetostriction, $\lambda$, and in some cases, a decidedly positive magnetostriction, $\lambda$. An example of a free-layer material with a high positive value of magnetostriction, $\lambda$, is a Co—Fe—B alloy with a B content of several atomic percent.

Figure 32:
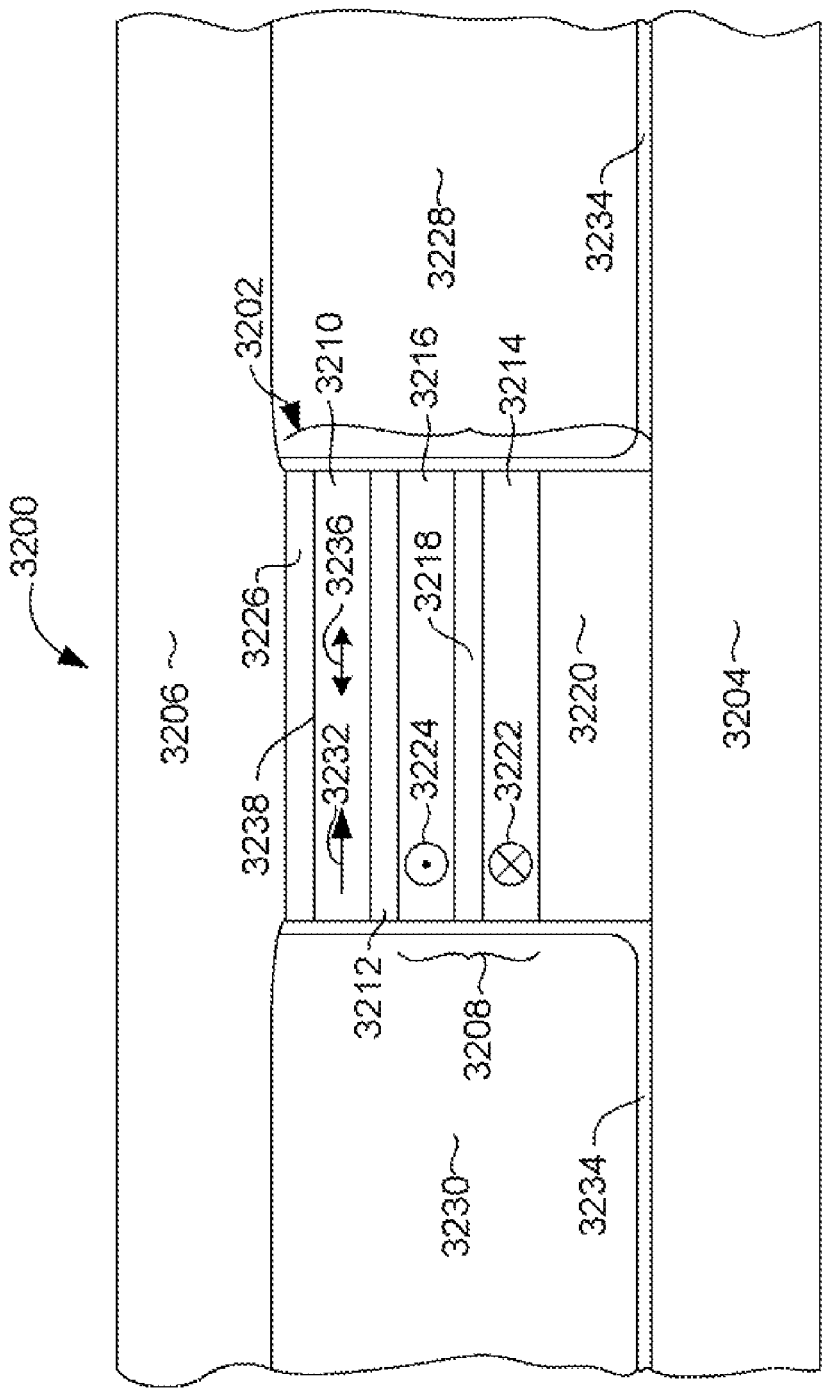
FIG. 32 is an ABS view of a magnetoresistive head having a magnetically stable free layer with a positive magnetostriction.

With reference now to FIG. 32, a magnetoresistive sensor 3200 according to an embodiment of the invention is illustrated that can be fabricated with a free layer having a positive magnetostriction while still maintaining a desired easy axis of magnetization parallel with the ABS. The sensor 3200 includes a sensor stack 3202 that is sandwiched between first and second electrically conductive leads 3204, 3206, which can be fabricated from a magnetic, electrically conductive material such as a Ni—Fe alloy so that they may function as magnetic shields, as well as leads. Although the presently described embodiment is being described in terms of a current-perpendicular-to-plane (CPP) sensor, it should be understood that the invention could just as easily be embodied in a current-in-plane (CIP) sensor, in which case the leads 3204, 3206 would be replaced with electrically insulating gap layers.

The sensor stack 3202 includes a pinned-layer structure 3208, and a magnetic free-layer structure 3210. The free-layer structure (as shown) is usually a single free layer of ferromagnetic material; but the free-layer structure can also comprise: a pair of AP-coupled free layers, a laminated bilayer of ferromagnetic materials, and even more complicated structures. A thin, nonmagnetic, electrically insulating barrier layer 3212 can be sandwiched between the pinned and free-layer structures 3208, 3210. The sensor 3200 will be described herein as a tunneling magnetoresistive (TMR) sensor, also known in the art as a magnetic tunnel junction (MTJ) or tunnel valve (TV) sensor, having a barrier layer 3212. However, it should be understood that the sensor could just as well be an alternative type of current-perpendicular-to-plane, giant magnetoresistive (CPP-GMR) sensor, for example, one in which the layer 3212 would be a nonmagnetic, electrically conductive spacer layer such as Cu.

The pinned-layer structure can be fabricated as an antiparallel coupled, (AP-coupled) pinned-layer structure having first and second magnetic layers 3214, 3216 fabricated from a magnetic material such as a Co—Fe alloy. The magnetic layers 3214, 3216 are antiparallel coupled across an antiparallel-coupled layer 3218 such as Ru that is sandwiched between the first and second magnetic layers 3214, 3216. One of the magnetic layers 3214 is exchange coupled with a layer of antiferromagnetic (AFM) material 3220 such as an Ir—Mn alloy, an Ir—Mn—Cr alloy, or a Pt—Mn alloy, the preferred compositions of each being about 70-80 atomic percent Mn and the balance Ir, about 75 atomic percent Mn, about 5 atomic percent Cr and the balance Ir, or about 50 atomic percent Mn and the balance Pt, respectively, which pins the magnetization of the first magnetic layer 3214 (represented by arrow tail 3222) in a first direction perpendicular to the ABS. Strong antiparallel coupling between the first and second magnetic layers 3214, 3216 pins the magnetization of the second magnetic layer (indicated by arrow head 3224) in a direction opposite to the magnetization 3222 of the first magnetic layer 3214. A capping layer 3226 such as Ta may be formed at the top of the sensor stack 3202 to protect the layers of the sensor stack during manufacture.

With reference still to FIG. 32, first and second hard-bias layers 3228, 3330, which can be fabricated from a hard magnetic material such as a Co—Pt alloy, or a Co—Pt—Cr alloy, extend laterally from either side of the sensor stack 3202. The hard-bias layers 3228, 3230 are magnetized to provide a bias field that biases the magnetization of the free-layer structure 3210 in a desired direction substantially parallel with the ABS as indicated by arrow 3232. Side insulation layers 3234 are provided at the side of the sensor stack 3202 and across at least one of the leads 3204 to prevent current from being shunted between the leads 3204, 3206 across the hard-bias layers 3228 3230.

As mentioned above it is important that the magnetization 3232 of the free-layer structure 3210 remain stable. However, as sensors become even smaller, this stable magnetization becomes harder to maintain. In addition, increasing the sensor performance requires the use of new, previously unusable free-layer materials. As mentioned above, acceptable free-layer materials have been limited to materials having a negative, or zero, magnetostriction. This was necessary to avoid having an easy axis of magnetization that would be oriented perpendicular to the ABS (into and out of the plane of the figure in FIG. 32). The present invention overcomes this limitation, allowing materials having a positive magnetostriction to be used in the free-layer structure 3210 while still maintaining an easy axis of magnetization that is oriented substantially parallel to the ABS as desired.

Therefore, according to the present invention, the free-layer structure 3210 comprises a material having a positive magnetostriction. More preferably, the free-layer structure comprises a free layer of a Co—Fe—B alloy. For example, the Co—Fe—B alloy free layer could have 10-30 atomic percent B or about 20 atomic percent B and could have a Fe content of 5-15 atomic percent or about 8 atomic percent, i.e. $Co_{72}Fe_8Be_{20}$. The free-layer structure 3210 has a magnetic anisotropy with an easy axis of magnetization that is oriented substantially parallel with the ABS as indicted by double ended arrow 3236. The free-layer structure has a surface 3238 that is configured with an anisotropic surface texture, or roughness, that induces the magnetic anisotropy with an easy axis of magnetization 3236 as previously described. This means that the interface between the free-layer structure 3210 and the Ta capping layer 3226 will have an anisotropic surface texture, roughness, or waviness.

Figure 33:
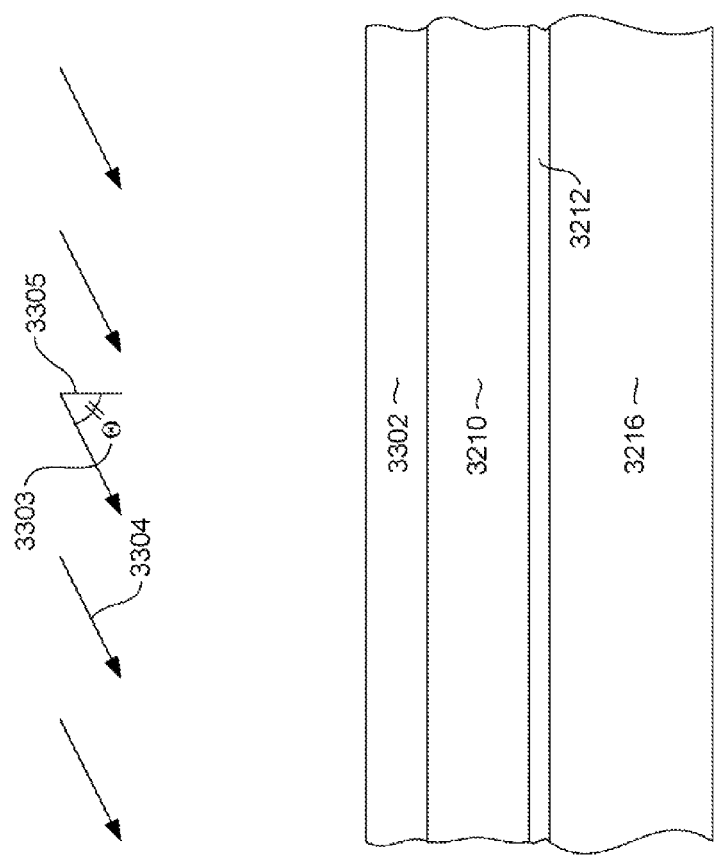
FIG. 33 is a side cross-sectional view illustrating a method for creating a free layer having a positive magnetostriction and a magnetic anisotropy with an easy axis of magnetization parallel to the ABS.

The magnetic anisotropy with an easy axis of magnetization 3236 provided by the anisotropic surface texture 3238 allows the free-layer structure 3210 to be fabricated from a positive magnetostriction material such as a Co—Fe—B alloy. With reference now to FIG. 33, a method will be described for fabricating the free layer structure having the desired magnetic anisotropy with an easy axis of magnetization 3236. The sensor is deposited upon a wafer that is held upon a chuck in a sputter deposition tool. The chuck, wafer, and sputter deposition tool are not shown in FIG. 33. For purposes of clarity, not all of the sensor layers are shown in FIG. 33. After the magnetic layer 3216 and barrier, or spacer, layer 3212 have been deposited, such as by sputter deposition, the free-layer structure 3210 is deposited. The free-layer structure 3210 is deposited by sputter depositing a layer of magnetic material having a positive magnetostriction. Preferably, the free-layer structure is deposited by sputter depositing a free layer of a Co—Fe—B alloy in a sputter deposition tool. The Co—Fe—B alloy can be deposited to a thickness of 20-40 Angstroms or about 28 Angstroms, and as mentioned above, can have a B content of 10-30 atomic percent or about 20 atomic percent, i.e. $Co_{72}Fe_8Be_{20}$.

At such high boron contents, the Co—Fe—B alloy is an amorphous material, i.e. a material having a microstructure substantially consisting of disordered regions wherein the atoms are disarrayed with respect to a lattice having no well-defined, long-range order. In order for the soon-to-be-described surface treatment to function most effectively, it is preferably performed on crystalline material, i.e. a material having a microstructure comprised of well-ordered crystals wherein the atoms are arranged on a lattice having substantially well-defined, long-range order. Therefore, after depositing the free-layer structure 3210, a layer of a crystalline material 3302, preferably Co—Fe alloy, is deposited over the free-layer structure 3210. The crystalline layer 3302 can be deposited to a thickness of, for example, 40 to 60 Angstroms, or about 50 Angstroms, and can be deposited by sputter deposition. Other thickness can, of course be used as well. After depositing the crystalline layer 3302, an angled ion milling, or etching, is performed by directing an ion beam 3304 at an acute angle, Θ 3303, relative to normal 3305 while the sensor is held on a stationary chuck, i.e. a chuck that is not rotated during ion milling. This angled ion-milling operation can be more fully understood with reference to FIGS. 5A-5D, wherein the material layer 502 corresponds to the crystalline layer 3302, and may also include a portion of the free-layer structure 3210.

The angled ion milling is performed sufficiently to remove the crystalline layer 3302, i.e. until the free-layer structure 3210 is reached. The angled ion milling creates an anisotropic surface texture in the crystalline layer 3302, and this surface texture carries through to, and is replicated in, the free-layer structure 3210 resulting in a free-layer structure 3210 having an anisotropic surface texture that results in a magnetic anisotropy with an easy axis of magnetization oriented in a desired direction, i.e. parallel to the ABS in the finished sensor.

The angled ion milling removes the materials of the crystalline layer 3302 and the free-layer structure 3210 at a slow rate of about 10 Angstroms per minute. Therefore, the free-layer thickness can be easily controlled to within 1-2 Angstroms. In addition, in order to ensure an even milling, the sensor is milled from both directions, by performing a first ion milling, and then rotating the chuck 180 degrees and performing a second ion milling. This avoids having a mill-thickness wedge on the first-layer structure. Using such a process, one can achieve uniformities of within 5% from the inside to the outside of the free-layer structure 3210 of about 1-2 Angstroms. The ion milling can be performed with Ar+ ions at low energies, for example, between 50-150 eV or about 70 eV. This is just above the sputter threshold of Co—Fe and just enough to texture the surface. The ion milling can also be performed at relatively low doses. The anisotropic surface texture, or roughness, produced by the above-described process can achieve a desired magnetic anisotropy with an associated anisotropy field 50-500 Oe, depending upon the amount of ion milling performed and other factors. The resulting anisotropy field, of the free-layer structure, is more than sufficient to overcome the original magnetic anisotropy arising from the positive magnetostriction of the material making up the free-layer structure 3210. Furthermore, the final amount of magnetic anisotropy achieved can be controlled, as desired, by controlling the process parameters. Depending on process conditions, the orientation of the anisotropic surface texture can be either substantially parallel to, or substantially perpendicular to, the orientation of the easy axis of magnetization associated with the final level of magnetic anisotropy that results after treatment of the free-layer structure with angled ion milling.

Figure 34:
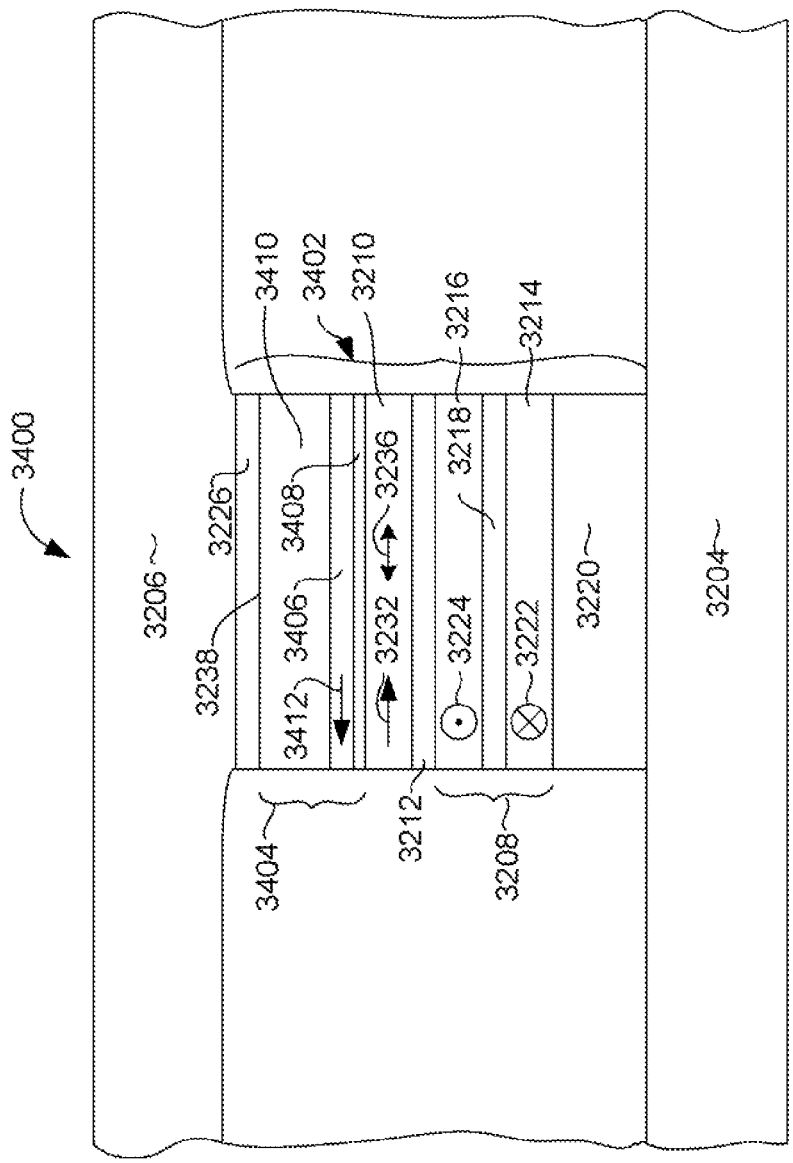
FIG. 34 is an ABS view of a magnetoresistive head having a magnetically stable free layer with a positive magnetostriction according to an alternative embodiment of the invention.

With reference now to FIG. 34, an alternative embodiment of the invention is shown that uses an in-stack bias structure for biasing the free-layer structure, rather than the side hard-bias layers described above. As shown in FIG. 34, a sensor 3400 includes a sensor stack 3402 having an in-stack bias structure 3404. The in-stack bias structure 3404 can include a magnetic biasing layer 3406 such as a Co—Fe alloy, or some other magnetic material. The biasing layer is separated from the free-layer structure 3210 by a nonmagnetic layer 3408 that magnetostatically couples the bias layer 3406 with the free-layer structure 3210. The bias layer can also be exchange coupled with a layer of antiferromagnetic material 3410 such as an Ir—Mn alloy, an Ir—Mn—Cr alloy, or a Pt—Mn alloy, the preferred compositions of each being about 70-80 atomic percent Mn and the balance Ir, about 75 atomic percent Mn, about 5 atomic percent Cr and the balance Ir, or about 50 atomic percent Mn and the balance Pt, respectively, that pins the magnetization of the bias layer 3406 in a desired direction parallel with the ABS as indicated by arrow 3412. The magnetostatic coupling between the bias layer 3406 and the free-layer structure 3210 biases the magnetization 3232 of the free-layer structure 3210 in a direction substantially parallel with the ABS desired. Since there are no magnetic, hard-bias layers at the sides of the sensor stack 3402, the space between the leads 3204, 3206 at either side of the sensor stack 3402 can be filled with a nonmagnetic, electrically insulating material such as alumina, in order to avoid current shunting between the leads 3204, 3206.

The free-layer structure 3210 has a magnetic anisotropy with an easy axis of magnetization that is oriented substantially parallel with the ABS as indicated by double ended arrow 3236. The free-layer structure has a surface 3238 that is configured with an anisotropic surface texture, or roughness, that induces the magnetic anisotropy with an easy axis of magnetization 3236 as previously described. This means that the interface between the free-layer structure 3210 and the nonmagnetic layer 3408 will have an anisotropic surface texture, roughness, or waviness.

While various embodiments have been described above, it should be understood that they have been presented by way of example only, and not limitation. Other embodiments falling within the scope of the invention may also become apparent to those skilled in the art. Thus, the breadth and scope of the invention should not be limited by any of the above-described, exemplary embodiments, but should be defined only in accordance with the following claims and their equivalents.

What is claimed is:

1. A magnetoresistive sensor, comprising:
a magnetic free-layer structure;
a magnetic pinned-layer structure; and
a nonmagnetic layer sandwiched between the free-layer structure and the pinned-layer structure; wherein
the free-layer structure comprises a material having a positive magnetostriction and has a surface that is configured with an anisotropic surface texture; and wherein
the anisotropic surface texture is in the form of ripples having an average pitch of 10-200 nm.

2. A sensor as in claim 1 wherein the free-layer structure comprises a free layer of a Co—Fe—B alloy.

3. A sensor as in claim 2 wherein the free layer comprises a Co—Fe—B alloy having a B content of 10 to 30 atomic percent.

4. A sensor as in claim 1 wherein the nonmagnetic layer sandwiched between the free-layer structure and the pinned-layer structure is one of the group consisting of an electrically insulating barrier layer wherein the sensor is a tunneling magnetoresistive (TMR) sensor and an electrically conductive spacer layer wherein the sensor is a current-perpendicular-to-plane, giant magnetoresistive (CPP-GMR) sensor.

5. A sensor as in claim 1 wherein the free-layer structure further has a magnetic anisotropy with an easy axis of magnetization.

6. A sensor as in claim 5 wherein the sensor has an Air-bearing Surface (ABS) and wherein the easy axis of magnetization associated with the magnetic anisotropy in the free-layer structure is oriented substantially parallel with the ABS.

7. A magnetoresistive sensor, comprising:
a magnetic free-layer structure;
a magnetic pinned-layer structure; and a nonmagnetic layer sandwiched between the free-layer structure and the pinned-layer structure; wherein
the free-layer structure comprises a material having a positive magnetostriction and has a surface that is configured with an anisotropic surface texture; and wherein
the free layer comprises $Co_{72}Fe_8Be_{20}$.

8. A magnetoresistive sensor, comprising:
a magnetic free-layer structure;
a magnetic pinned-layer structure; and
a nonmagnetic layer sandwiched between the free-layer structure and the pinned-layer structure; wherein
the free-layer structure comprises a material having a positive magnetostriction and has a surface that is configured with an anisotropic surface texture; and
wherein the anisotropic surface texture is in the form of ripples having an average depth of 0.5-5 nm.

9. A magnetoresistive sensor, comprising:
a magnetic free layer;
a magnetic pinned-layer structure; and
a nonmagnetic layer sandwiched between the free layer and the pinned-layer structure; wherein
the free layer comprises a Co—Fe—B alloy and has a surface that is configured with
an anisotropic surface texture; and wherein
the anisotropic surface texture is in the form of ripples having an average depth of 0.5-5 nm.

10. A sensor as in claim 9 wherein the free layer comprises a Co—Fe—B alloy having a B content of 10 to 30 atomic percent.

11. A sensor as in claim 9 wherein the nonmagnetic layer sandwiched between the free layer and the pinned-layer structure is one of the group consisting of an electrically insulating barrier layer wherein the sensor is a tunneling magnetoresistive (TMR) sensor and an electrically conductive spacer layer wherein the sensor is a current-perpendicular-to-plane, giant magnetoresistive (CPP-GMR) sensor.

12. A sensor as in claim 9 wherein the free layer further has a magnetic anisotropy with an easy axis of magnetization.

13. A sensor as in claim 12 wherein the sensor has an Air-bearing Surface (ABS) and wherein the easy axis of magnetization associated with the magnetic anistropy in the free layer is oriented substantially parallel with the ABS.

14. A magnetoresistive sensor,
comprising:
a magnetic free layer;
a magnetic pinned-layer structure; and
a nonmagnetic layer sandwiched between the free layer and the pinned-layer structure; wherein
the free layer comprises a Co—Fe—B alloy and has a surface that is configured with an anisotropic surface texture; and
wherein the free layer comprises $Co_{72}Fe_8Be_{20}$.

15. A magnetoresistive sensor,
comprising:
a magnetic free layer,
a magnetic pinned-layer structure; and
a nonmagnetic layer sandwiched between the free layer and the pinned-layer structure; wherein
the free layer comprises a Co—Fe—B alloy and has a surface that is configured with an anisotropic surface texture; and
wherein the anisotropic surface texture is in the form of ripples having an average pitch of 10-200 nm.

16. A magnetic data storage system, comprising:
a housing;
a magnetic recording medium rotatably mounted within the housing;
a slider;
an actuator, connected with the slider for moving the slider relative to a surface of the magnetic recording medium; and
a magnetoresistive sensor connected with the slider, the magnetoresistive sensor comprising:
a magnetic free layer;
a magnetic pinned-layer structure; and
a nonmagnetic layer sandwiched between the free layer and the pinned-layer structure; wherein
the free layer comprises a $Co_{72}Fe_8Be_{20}$ alloy and has a surface that is configured with an anisotropic surface texture.

17. A sensor as in claim 16 wherein the free layer further has a magnetic anisotropy with an easy axis of magnetization.

18. A sensor as in claim 16 wherein the sensor has an Air-bearing Surface (ABS) and wherein the easy axis of magnetization associated with the magnetic anistropy in the free layer is oriented substantially parallel with the ABS.

* * * * *

UNITED STATES PATENT AND TRADEMARK OFFICE
CERTIFICATE OF CORRECTION

PATENT NO. : 7,791,844 B2
APPLICATION NO. : 11/737701
DATED : September 7, 2010
INVENTOR(S) : Matthew Joseph Carey et al.

It is certified that error appears in the above-identified patent and that said Letters Patent is hereby corrected as shown below:

In claim 13, column 28, line 5 replace "anistropy" with --anisotropy--.

Signed and Sealed this
First Day of February, 2011

David J. Kappos
*Director of the United States Patent and Trademark Office*